United States Patent [19]

Moore

[11] Patent Number: 5,207,835
[45] Date of Patent: * May 4, 1993

[54] HIGH CAPACITY EPITAXIAL REACTOR

[75] Inventor: Gary M. Moore, San Jose, Calif.

[73] Assignee: Moore Epitaxial, Inc., San Jose, Calif.

[*] Notice: The portion of the term of this patent subsequent to Oct. 1, 2008 has been disclaimed.

[21] Appl. No.: 477,396

[22] Filed: Feb. 9, 1990

Related U.S. Application Data

[63] Continuation-in-part of Ser. No. 317,260, Feb. 28, 1989, Pat. No. 5,053,247.

[51] Int. Cl.$^5$ ............................................. C23C 16/48
[52] U.S. Cl. ...................................... 118/725; 118/724; 118/730
[58] Field of Search ................ 118/715, 724, 725, 730

[56] References Cited

U.S. PATENT DOCUMENTS

| | | | |
|---|---|---|---|
| 3,623,712 | 11/1972 | McNeilly et al. | 118/725 |
| 3,796,182 | 3/1974 | Rosler | 118/725 |
| 3,862,397 | 1/1975 | Anderson | 118/725 |
| 4,047,496 | 9/1977 | McNeilly et al. | 118/725 |
| 4,099,041 | 7/1978 | Berkman et al. | 118/728 |
| 4,322,592 | 3/1982 | Martin | 118/730 |
| 4,511,788 | 4/1985 | Arai | 219/343 |
| 4,728,389 | 3/1988 | Logar | 156/612 |
| 4,789,771 | 12/1988 | Robinson | 118/730 |
| 5,053,247 | 10/1991 | Moore | 427/55 |

FOREIGN PATENT DOCUMENTS 61-210622 9/1986 Japan .

OTHER PUBLICATIONS

"Precision 7700 Epi System Specifications", Applied Materials, 1989.
AMC 7810 and 7820 Radiantly Heated Epitaxial Reactor Systems, p. 11.
*Semiconductor Silicon 1973*, The Electrochemical Society, Inc.

*Primary Examiner*—Richard Bueker
*Attorney, Agent, or Firm*—Skjerven, Morrill, MacPherson, Franklin & Friel

[57] ABSTRACT

A barrel epitaxial reactor having a greater batch capacity than prior art barrel epitaxial reactors which produces an epitaxial layer quality at least as good as that produced by the prior art barrel epitaxial reactors is disclosed. The batch capacity of prior art barrel epitaxial reactors is improved by increasing the reaction chamber size and increasing the radiant heat source so that a uniform temperature is maintained over a larger flat zone in the reaction chamber. Also, forced air flow from the blower of the prior art reactor is distributed so that a positive air flow is maintained along the exterior wall of the reaction chamber and consequently the wall is maintained at a uniform cold temperature relative to the temperature of the reaction chamber.

42 Claims, 14 Drawing Sheets

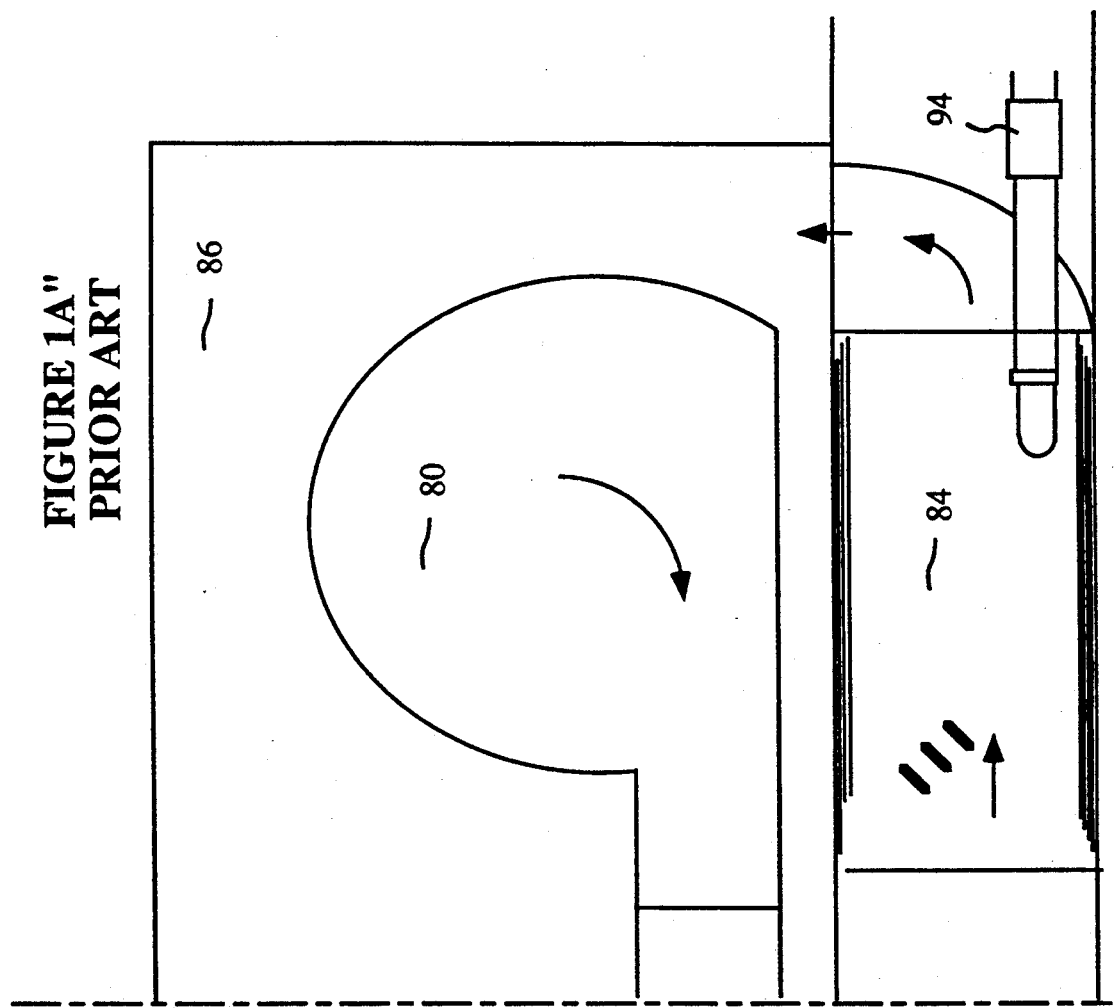
FIGURE 1A"
PRIOR ART

KEY TO FIGURE 3A

| 3A' | 3A" |

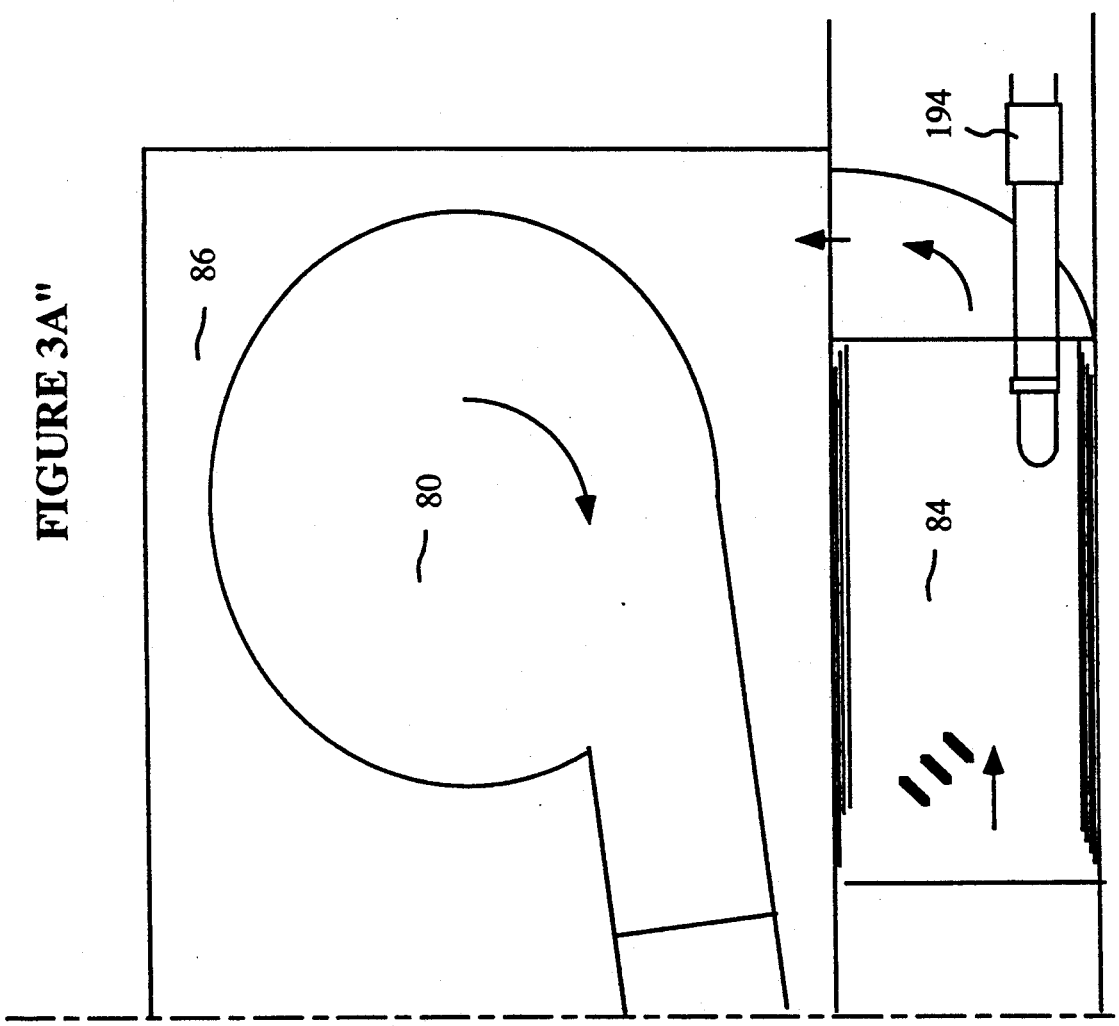

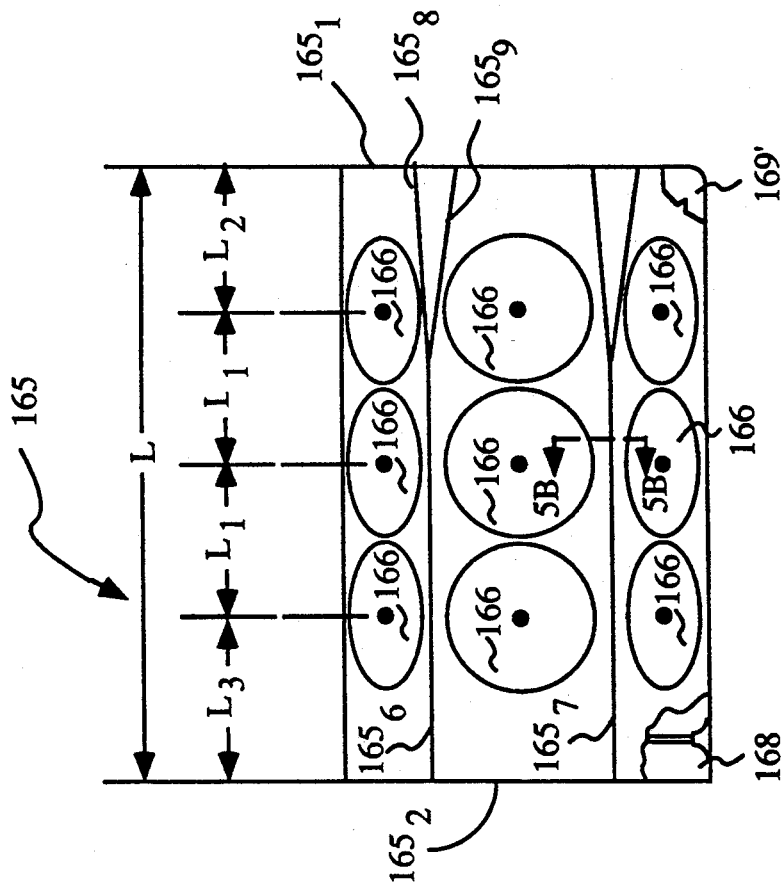
FIGURE 5B
5B - 5B
FIGURE 5D
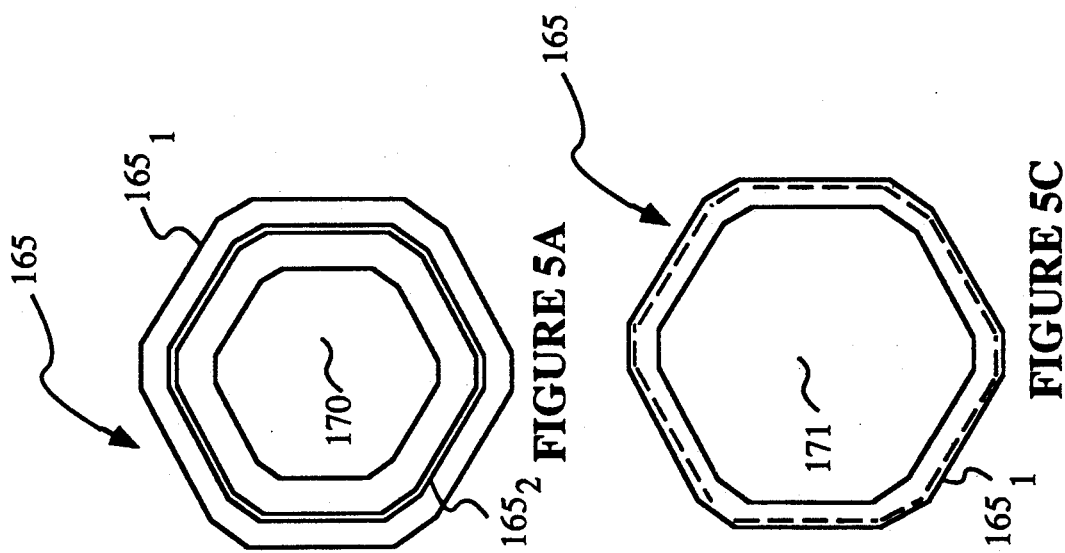
FIGURE 5A
FIGURE 5C

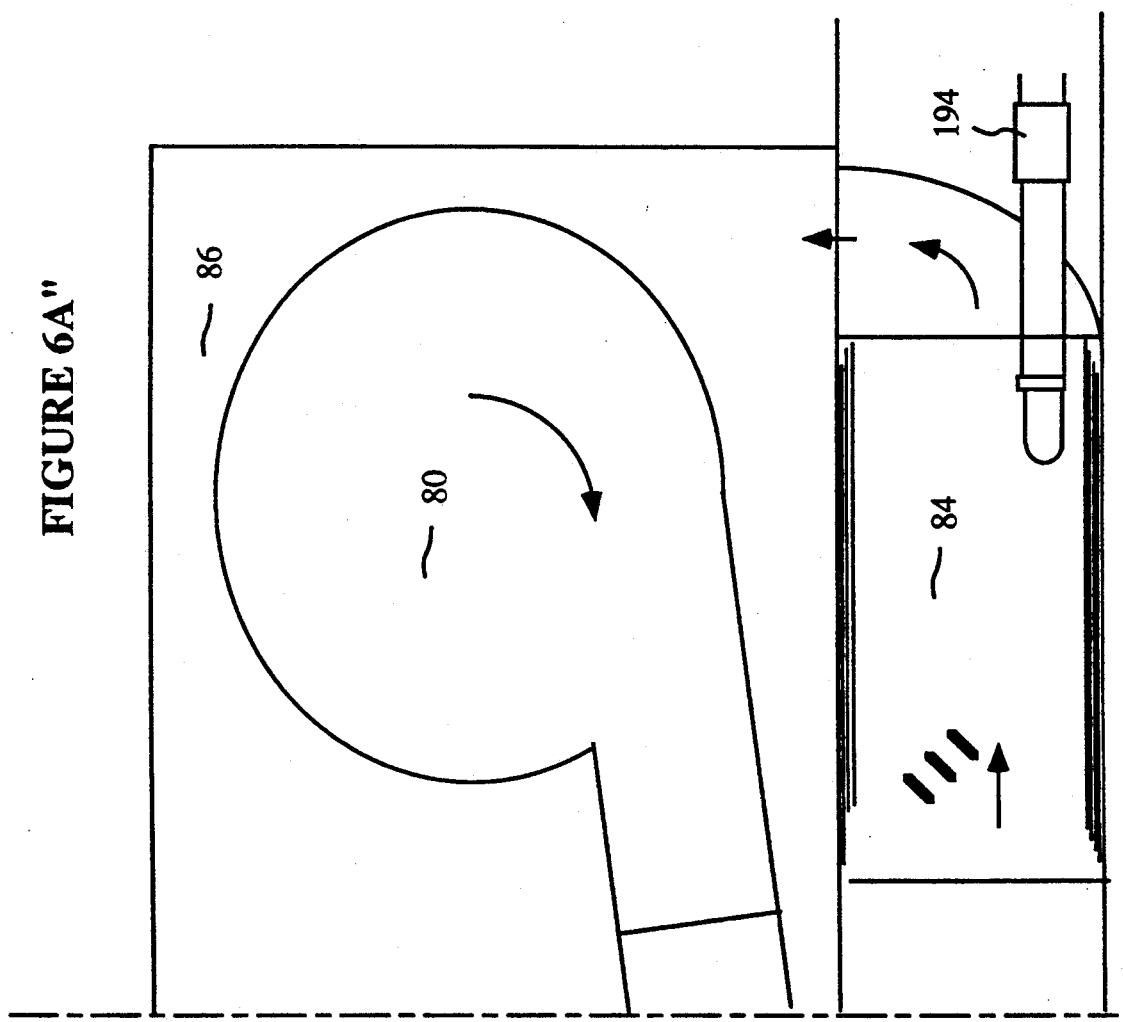

HIGH CAPACITY EPITAXIAL REACTOR

RELATED APPLICATION

This application is a continuation-in-part of copending and commonly assigned U.S. Patent application Ser. No. 07/317,260, entitled "A High Capacity Epitaxial Reactor" and filed by Gary M. Moore on Feb. 28, 1989, now U.S. Pat. No. 5,053,247.

BACKGROUND OF THE INVENTION

1. Field of the Invention

This invention relates generally to epitaxial reactors for producing uniform film coatings on selected surfaces and more particularly to a barrel epitaxial reactor, which has a greater batch capacity than prior art barrel epitaxial reactors and which produces an epitaxial layer quality at least as good as that produced by the prior art barrel epitaxial reactors.

2. Description of the Prior Art

Several alternative types of radiant heating epitaxial reactors are known in the prior art. See, for an example of one type of epitaxial reactor, U.S. Pat. No. 4,081,313 issued on Mar. 28, 1978 to McNeilly et al. Generally, each epitaxial reactor has (i) a reaction chamber, (ii) a heat source and temperature control, and (iii) gas sources and a gas flow controller.

A side cross sectional view of one prior art barrel epitaxial reactor is shown in FIG. 1A. Reactor 10 is available from Applied Materials of Santa Clara, Calif. Reactor 10 is supplied by Applied Materials under Model Nos. 7600, 7800, 7810 and 7820.

Reaction chamber 60 of reactor 10 is the interior volume of bell jar 40 between transition region 46 and edge 45A of bead-blasted region 45. Heat source 50 consists of five banks of quartz halogen lamps 51. Each bank of lamps 51 consists of a column of fourteen lamps 51, as described more completely below. Gas ring 20 is connected to the gas sources and a gas controller. Heat source 50 and reactor chamber 60 are contained within housing 15. Housing 15 of reactor 10 bounds a volume which is about 36 inches high and about 46 inches wide.

The five banks of lamps 51 in heat source 50 form a pentagon about bell jar 40, as illustrated in FIG. 1B, with each bank occupying one side of the pentagon. In FIG. 1B, only the relative positions of the five banks of heat source 50 and bell jar 40 are represented for clarity. (The figures are not drawn to scale and are intended to only show the relative positions of components within reactor 10.) Lamps 51 produce radiant energy in the short wavelength range, i.e., approximately one micron or below. Each lamp 51 is mounted in a one and one-eighth inch parabolic gold plated highly polished reflector 52. (In the Figures, subscripts on reference numerals are used to (i) represent similar components and (ii) to denote particular features of a component. In the description, a reference numeral without a subscript is used as a shorthand notation to refer to all occurrences of that reference numeral with subscripts in the drawings).

The short wavelength radiant energy from heat source 50 is transmitted through transparent quartz wall 41 of bell jar 40. Quartz wall 41 absorbs little or no radiation. Radiant energy from heat source 50 is incident on a susceptor 65 mounted within reaction chamber 60. Susceptor 65 is suspended in bell jar 40 by a quartz hanger 61 which in turn is rotatably connected through opaque quartz top flange 47 to a rotation means (not shown) so that susceptor 65 and wafers 70 mounted thereon can be rotated relative to heat source 50. The rotation of susceptor 65 ensures uniform heating of susceptor 65 and wafers 70.

Susceptor 65 is made from a material that absorbs the radiant energy from heat source 50 and provides a uniform temperature surface for wafers 70. Susceptor 65 is usually made of graphite and coated with a thin coating of silicon carbide over the outer surface. The silicon carbide coating prevents contamination of wafers 70 with carbon.

The size of susceptor 65 limits the capacity of reactor 10 because the size determines the number of wafers, i.e., the batch capacity, which can be placed in reaction chamber 60 at one time. The "batch capacity" is sometimes referred to as the "batch size". Table 1 lists the batch capacity of barrel epitaxial reactor 10.

TABLE 1

| Batch Processing Capacity of Barrel Epitaxial Reactor 10 | |
|---|---|
| Wafer Diameter (mm) | Batch Size |
| 100 | 24 |
| 125 | 12 |
| 150 | 10 |
| 200 | 4 |

Susceptor 65 has a length of approximately 16.75 inches and provides a flat zone of approximately 12 inches. As used herein, the length of susceptor 65 refers to the vertical dimension of susceptor 65. The vertical dimension of susceptor 65 or of any other component in reactor 10 is the dimension in the same direction as the direction extending from the gas entrance of reaction chamber 60 (the top of reaction chamber 60) to the gas exit of reactor chamber 60 (the bottom of reaction chamber 60).

The "flat zone" of susceptor 65 is the region on each face of the exterior surface of susceptor 65 where wafers may be placed and uniform epitaxial depositions achieved on the wafers. Flat zone 67 of susceptor 65 is illustrated in FIG. 1 by the dashed line which encloses wafers 70.

Another criteria used to measure the capacity of the barrel reactor is the percentage of the surface area of the susceptor covered by the wafers being processed. For reactor 10, a six-sided susceptor is used to process 125 mm diameter wafers Two wafers are placed on each face of the susceptor to give the twelve wafer batch size in Table 1. The area of one face of the susceptor is about 86.645 in$^2$ (559.0 cm$^2$). The area in contact with the susceptor of two 125 mm diameter wafers is about 38.04 in$^2$ (245.44 cm$^2$). Hence, the percentage of a susceptor face covered by the wafers is $38.04 \div 86.645$ or about 44%.

For processing of 200 mm diameter wafers, a four sided susceptor with an area of about 134.370 in$^2$ (866.90 cm$^2$) per face is used. Each face of the susceptor holds one wafer with an area of 48.7 in$^2$ (314.16 cm$^2$). Thus, for 200 mm diameter wafers the percentage of a susceptor face covered by the wafer is $48.7 \div 134.370$ or about 36%.

For processing of 100 mm diameter wafers, an eight sided susceptor with an area of about 78.02 in$^2$ (503.35 cm$^2$) per face is used. Each face of the susceptor holds three wafers. Each wafer has an area of about 12.2 in$^2$ (78.54 cm$^2$). Thus, for 100 mm diameter wafers the percentage of a susceptor face covered by wafers is about $(12.2 \times 3) \div 78.02$ or about 47%.

For processing of 150 mm diameter wafers, a five sided susceptor with an area of about 116.09 in$^2$ (748.97 cm$^2$) per face is used. Each face of the susceptor holds two wafers. Each wafer has an area of about 27.4 in$^2$ (176.71 cm$^2$). Thus, for 100 mm diameter wafers the percentage of a susceptor face covered by the wafers is about (27.4×2)÷116.09 or about 47%.

For reactor 10 (FIG. 1A), flat zone 67 is defined so that the variation in thickness of the epitaxial layers from wafer to wafer on adjacent wafers is at most ±5% and the variation in resistivity of the epitaxial layers from wafer to wafer on adjacent wafers is at most ±5-10%. Across flat zone 67, the thickness variation of the epitaxial layers from wafer to wafer on any two non-adjacent wafers, including wafers at opposite ends of the flat zone, is at most ±4-7% and the resistivity variation from wafer to wafer on any two non-adjacent wafers is at most ±4-12%. These variations are the industry standards for growth of epitaxial layers.

Quartz bell jar 40, in which susceptor 65 is mounted, has a lower flange 42 which is connected to a lower support 43 for bell jar 40. O-ring 24 provides a seal between lower flange 42 and exhaust cup 30. Lower support 43, about 3 inches in length, is connected to side wall 41 by lower curved portion 44 of jar 40. Lower curved portion 44 has been bead-blasted (i.e., subjected to a high velocity stream of beads, typically of 180 grit glass beads) to produce an opaque surface region 45. Edge 45A is the end of bead-blasted lower curved portion 44. As previously described, edge 45A defines the bottom of reaction chamber 60. Transparent vertical sidewall 41 of quartz bell jar 40 terminates in a transition region 46 to which opaque quartz top flange 47, typically made of white quartz, is connected. Transition region 46 is about three inches in length.

The spatial relationship between side wall 41, curved portion 44, lower support 43 and transition region 46 affects the gas flow dynamics, e.g., the gas velocity, the gas mass flux, the flow mixing, and the flow turbulence within reaction chamber 60. If the spatial relationship of these portions of bell jar 40 is modified, the gas flow dynamics within reaction chamber 60 are altered. Since the uniform growth of the epitaxial layers in reaction chamber 60 is directly dependent upon the gas flow dynamics, any modification to bell jar 40 affects the uniformity of the epitaxial layers grown.

Opaque top flange 47 rests on a base plate 32 and is sealed by an O-ring 21 between base plate 32 and top flange 47. Top flange 47 is secured by a gas ring 20 and two O-rings 22, 23. The reactant gases are introduced into reaction chamber 60 through gas ring 20. After the gases pass through reaction chamber 60, the gases are exhausted through an opening or openings in lower flange 42 into stainless steel exhaust cup 30. Exhaust cup 30 is attached to support assembly 31 which positions bell jar 40 within epitaxial reactor 10.

The gas flow through reaction chamber 60 depends upon the desired epitaxial growth rate and the process specifications. In reactor 10, the epitaxial growth is a function of the hydrogen flow and the flow of the other reactant gases through chamber 60. The gas flow into reaction chamber 60 is controlled using jet settings that are adjusted to separate points on a grid and control of hydrogen main flow and hydrogen rotation flow. The control of jet settings and hydrogen flow is known by one skilled in the art. For reactor 10, typical jet settings on the grid for uniform epitaxial layer growth are 3.5 and 3.5 and a typical hydrogen flow setting for uniform epitaxial layer growth is a main flow of 120 liters per minute (l/m) and a rotation flow of 100 l/m.

Epitaxial growth on wafers 70 within reactor 10 requires temperatures within the range of about 900° to 1200° C. However, quartz wall 41 is typically maintained at about 600° C., so that relative to the 900°–1200° C. temperatures in reaction chamber 60, wall 41 is cold. Cold wall 41 of bell jar 40 limits growth of films on the interior surface of wall 41. As used herein, the "interior" surface and "exterior" surface of a bell jar are relative to reaction chamber 60, so that the "interior" surface is a boundary of reaction chamber 60 and the "exterior" surface is outside of reaction chamber 60.

Wall 41 must be maintained at a constant temperature, because if the temperature of wall 41 increases, films are deposited on wall 41. These films absorb radiant energy which in turn affects the uniformity of epitaxial layers grown in reactor 10.

To maintain wall 41 of bell jar 40 at the desired temperature and to protect the other components in reactor 10 from high temperatures, heat source 50 and the exterior surface of jar 40, i.e., transition region 46, wall 41 and curved portion 44 are cooled by forced air circulation. Specifically, a blower 80 provides a constant airflow to a supply plenum 81. Supply plenum 81 has a vertical riser 85 which is connected to water cooled heat exchanger 53 on the back of lamp assemblies 50. Thus, air from blower 80 enters supply plenum 81 and is passed through heat exchanger 53 on the back of lamp assemblies 50 through reflector 52 and around lamps 51 into region 62 between bell jar wall 41 and lamp assemblies 50.

Since there is a resistance to airflow from vertical riser 85 into region 62, some of the airflow from blower 80 is diverted from supply plenum 81 through two inch outer diameter pipe 82 into upper plenum region 63. The forced air flow from pipe 82 through upper plenum region 63 prevents hot stagnant air from accumulating in plenum region 63.

Forced air flow from region 63 and from vertical riser 85 flows down sidewall 41 of bell jar 40 into exhaust plenum 83, which is located at the bottom of reactor 10. The air passes through exhaust plenum 83 into a heat exchanger 84. Heat exchanger 84 is water cooled with a flow of about 5 gallons per minute. The cooling water flow is regulated by flow restrictor 94. Thus, the air is cooled as it flows through heat exchanger 84 and the cooled air from heat exchanger 84 flows into blower supply plenum 86.

In addition to the air cooling, upper plenum region 63 has a water cooled cooling plate 88 which has a gold plated surface adjacent to lamp assemblies 50. Similarly, supply plenum 81 is cooled by water cooled wall 89 which has a gold plated surface facing bell jar 40 that reflects radiant heat energy away from supply plenum 81. In addition, a gold plated protective collar 87 is mounted about lower flange 42 of bell jar 40. The gold plating on these components reflects radiant energy away from other components exterior to reaction chamber 60, and hence limits both heating losses from reaction chamber 60 and heating of components exterior to reaction chamber 60.

The forced air cooling of reactor 10 maintains a uniform wall temperature for the configuration of bell jar 40, heat source 50, supply, exhaust and upper plenums 81, 82, 63 shown in FIG. 1A. If the configuration of these components is changed, the forced air cooling of wall 41 and consequently the wall temperature is affected because the air flow over wall 41 would be changed. As the wall temperature increases, deposits start to grow on the wall which in turn affect the gas distribution within reaction chamber 60. Further, such a change in wall temperature modifies the temperature profile in the reaction chamber 60 which in turn can further affect the gas distribution within reaction chamber 60. The cumulative effect of such changes on the uniform growth of epitaxial layers is unknown.

Each of the five banks of heat source 50 has fourteen lamps 51 (FIG. 2A). The radiant energy from each lamp 51 is directly proportional to the voltage across the lamp. Therefore, as illustrated in Table 2, a higher voltage is applied to lamps $51_1$–$51_3$ and $51_{12}$–$51_{14}$ on the upper and lower periphery respectively of reactor chamber 60. Outermost lamps $51_1$, $51_{14}$ (FIG. 2A) of each bank have an applied voltage of 350 volts, while the next two lamps $51_2$, $51_3$ and $51_{12}$, $51_{13}$ each have an applied voltage of 300 volts. The remaining eight lamps $51_4$–$51_{11}$ each have an applied voltage of 240 volts.

TABLE 2

Voltage Distribution for Each Bank of Heat Source 50

| Lamp No. | Voltage | Lamp No. | Voltage |
|---|---|---|---|
| $51_1$ | 350 | $51_8$ | 240 |
| $51_2$ | 300 | $51_9$ | 240 |
| $51_3$ | 300 | $51_{10}$ | 240 |
| $51_4$ | 240 | $51_{11}$ | 240 |
| $51_5$ | 240 | $51_{12}$ | 300 |
| $51_6$ | 240 | $51_{13}$ | 300 |
| $51_7$ | 240 | $51_{14}$ | 350 |

The higher voltages are required for six outermost lamps $51_1$–$51_3$, $51_{12}$–$51_{14}$ in each bank to compensate for the boundary conditions, i.e., the energy absorbing structure at the top and bottom of reactor 10, and heat losses from susceptor 65 and reaction chamber 60.

Lamps 51 in each bank are separated into three groups: a first group consisting of lamps $51_1$–$51_5$; a second group consisting of lamps $51_6$–$51_9$; and a third group consisting of lamps $51_{10}$–$51_{14}$. Each group of lamps 51 is connected to a silicon controlled rectifier (SCR). The load on the SCR for the second group is only about 70% of the load on the other two SCRs. Since each lamp bank has fourteen lamps, two fourteen pin connectors are used to connect power to each bank of lamps.

An infrared sensor (not shown) is lowered through a sheath in quartz hanger 61 into susceptor 65 and is positionable at locations 64 in susceptor 65. Each of the three locations permits measurement of the radiant energy from one of the three groups of lamps as defined above. The infrared sensor is connected through a closed loop temperature control system to the power supply for heat source 50 and the voltage across lamps 51 is adjusted so as to obtain about the same temperature at each of three locations $64_1$, $64_2$, $64_3$ on susceptor 65.

To increase wafer 70 throughput of reactor 10 (i.e., the number of wafers which can be processed in each batch of wafers), flat zone 67 must be enlarged. If susceptor 65 is lengthened in the vertical direction to provide a larger flat zone 67, either spacing Y between bottom $65_1$ and line 45A must be decreased, or reaction chamber 60 must be lengthened. As spacing Y decreases, the flat zone is moved further into the boundary region of heat source 50. Hence, uniformity of epitaxial layers grown in reactor 10 is affected by a change in spacing Y.

Placing a larger reaction chamber 60 within housing 15 of reactor 10 does not appear possible because the larger chamber necessarily changes the relationship between the cooling apparatus used to maintain the temperature of wall 41, the heat source 50 and the temperature in reaction chamber 60 As previously described, such changes affect the uniform growth of epitaxial layers so that even if the modification is possible, the increased batch capacity may not have epitaxial layers within industry uniformity standards.

If a vertically longer reaction chamber 60 is placed in housing 15, the upper and lower edges of the larger chamber 60 are necessarily closer to housing 15. The exterior of housing 15 is coupled to the ambient temperature of the room in which reactor 10 is contained, while wall 41 is at about 600° C. and susceptor 65 at about 900°–1200° C. Thus, as reaction chamber 60 becomes larger, heat source 50 must maintain the large temperature differential between reaction chamber 60 and the ambient room temperature, but the resistance to heat flow from reaction chamber 60 decreases because reaction chamber 60 is closer to housing 15. Hence, the energy from heat source 50 must compensate for any increased heat losses from chamber 60 that result from the reduced resistance to heat flow from chamber 60. A larger heat source affects the gas flow dynamics within chamber 60 in a manner similar to that previously described for changes in bell jar 40, and consequently the epitaxial layer growth within chamber 60.

Moreover, the larger heat source may adversely affect other components in reactor 10. Reflector 52 behind heat source 50 is gold plated aluminum. Reflector 52 must be maintained at a temperature below the melting point of aluminum. Any increase in heat source 50 may result in overheating of the aluminum, which in turn would cause the plating to be deformed and subsequently introduce nonuniformities in heat source 50. Such nonuniformities would further alter the growth of epitaxial layers.

Reaction chamber 60 geometry (e.g., the size and shape of bell jar 40, the size and shape of susceptor 65, and the position of susceptor 65 within bell jar 40), heat source 50, gas flow, and forced air cooling of reactor 10 were selected to provide a maximum batch size with each wafer in the batch having an epitaxial layer within industry uniformity standards. To increase the batch size of reactor 10 requires changing at least reaction chamber 60 geometry so that more wafers can be placed within reaction chamber 60. In addition, other characteristics of the reactor would probably have to be modified.

Unfortunately, the characteristics of reactor 10 provide no guidance on how to increase the batch capacity of reactor 10 because, as described above, a change in one characteristic of the reactor affects other characteristics of the reactor. The gas flow dynamics in reaction chamber 60, the temperature profile in reaction chamber 60, the forced air cooling, heat losses from reaction chamber 60 and the reflection of radiant energy into and from reaction chamber 60 are all coupled so that a change in any one affects the others.

For example, if the vertical length of susceptor 65 is increased to hold more wafers, the increased length, in addition to the problems discussed above, increases drag on gas flow through reaction chamber 60. The change in gas flow affects the heat carried from the reaction chamber by the gas. In addition, heat source 50 must be increased to maintain the larger susceptor at a uniform temperature. The change in the heat source further affects the gas flow and the heat losses from the reaction chamber.

Therefore, a simple increase in the length of the susceptor alters many conditions in reactor 10 and each of these conditions affects the growth of epitaxial layers. Similarly, each change in reactor geometry, heat source, gas flow, and forced air cooling affects the uniform growth of epitaxial layers in reactor 10. Since the cumulative effect of these changes is unknown, the feasibility of increasing the batch size of reactor 10 is unknown.

As previously noted, reactor 10 was optimized to provide a maximum batch size within industry uniformity standards. Increasing the batch size of reactor 10 necessarily requires a reaction chamber geometry, heat source, and forced air cooling different from those currently used in reactor 10. Therefore, a new reactor which both increases the batch size of reactor 10 and maintains the epitaxial layer uniformity of reactor 10, is needed to improve the performance of reactor 10. As described more completely below, a prior art modification of reactor 10, which increased the batch size by about 50% for one size wafer, resulted in unacceptable variations in the uniformity of the epitaxial layers.

The prior art modification of reactor 10 did not use a larger susceptor, which would introduce the uncertainties discussed above, but rather the modification extended flat zone 67 of susceptor 65 in the vertical direction. Typically, flat zone 67 for wafers 70 is maintained a first selected distance 68 from top edge 65$_2$ and bottom edge 65$_1$ of susceptor 65, and a second selected distance 69 from side edges 65$_3$, 65$_4$. First and second distances 68, 69 are selected so that the surface temperature of susceptor 65 is nearly constant within flat zone 67.

The prior art modification of reactor 10 increased flat zone 67 of susceptor 65 by decreasing first selected distance 68. Therefore, flat zone 67 was closer to upper and lower edges 65$_2$, 65$_1$ of susceptor 65. To maintain the regions of flat zone 67 closest to edges 65$_2$, 65$_1$ at about 900° C.-1200° C. required raising the temperature of the susceptor over the increased length of flat zone 67. Therefore, a larger energy input to these regions was required to compensate for heat losses from edges 65$_2$, 65$_1$. Further, if the structure in regions immediately above and below the flat zone was heated by supplying more energy to these regions, the temperature differential between the adjacent structure and the flat zone would be lowered. The lower temperature differential would reduce the heat losses from the flat zone and the reduction in heat losses would help maintain a uniform temperature over the larger flat zone of susceptor 65.

Hence, in the prior art modification, heat source 50 (FIG. 2A) was replaced by heat source 50', as illustrated in FIG. 2B. Reflector 52 (FIGS. 1 and 2A), discussed above, has a lip 55 at the top and bottom which is formed at about a 90° angle to the body of reflector 52. In the modified heat source 50', as shown in FIG. 2B, ends 55' of reflector 52' were flared outward and reflector 52' was broken into three segments 52$_1$', 52$_2$', 52$_3$'. A one-eighth to one inch spacer 56 was inserted between the segments. The voltage on outer lamps 51$_1$', 51$_{14}$' was increased to 480 volts and the four lamps 51$_2$', 51$_3$', 51$_{12}$', 51$_{13}$' were operated at 240 volts. The higher voltages on lamps 51$_1$' and 51$_{14}$' provide a higher radiant energy output so as to compensate for the increased heat losses associated with moving flat zone 67' closer to the periphery of reaction chamber 60. Flared ends 55' of reflector 52' reflected radiant energy over a larger area than reflector 55, which, as described above, should help minimize heat losses from the larger flat zone.

The change in heat source 50 coupled with overlap of wafers on susceptor 65 was intended to increase the flat zone for 125 mm diameter wafers so that the batch size could be increased from 12 wafers to 18 wafers. Hence, the modification was intended to increase the surface area of the susceptor covered by the wafers from 44% to in the range of about 60-65%. However, the variation in resistivity of the epitaxial layer of adjacent wafers was about ±30%. The batch size for 100 mm, 150 mm and 200 mm diameter wafers was not changed by this modification.

Accordingly, based on these results, the batch size of reactor 10 for 125 mm diameter can be increased by about fifty percent only if a ±30% variation in resistivity of the epitaxial layer of adjacent wafers is acceptable. In addition, the uniformity standards for other wafer sizes must also be relaxed. In general, a ±30% variation is not acceptable so that heat source 50' (FIG. 2B) in combination with using a larger area of the susceptor is not a viable method for increasing the batch capacity of reactor 10.

These results demonstrate that increasing the batch capacity is not a simple process of scaling and compensating for anticipated effects of size changes. Rather, as described above, any change in reactor 10 results in a complex set of interactions which affect the uniformity of the epitaxial layer. Further, given the poor results obtained by increasing the energy output of the portion of heat source 50' closest to housing 15, increasing the capacity of reactor 10 by using a larger susceptor, as described above, does not appear feasible because the larger susceptor would appear to require a heat source similar to that illustrated in FIG. 2B. Therefore, the batch capacity of reactor 10, as given in Table 1, appears to be the best that can be achieved while maintaining industry standards for uniformity of the epitaxial layers.

SUMMARY OF THE INVENTION

Contrary to the results achieved in the prior art, according to the principles of this invention, a prior art barrel epitaxial reactor is configured to achieve an increased batch size. Unlike the prior art modifications which resulted in poor resistivity uniformity, the epitaxial barrel reactor, according to the principles of this invention, provides epitaxial layers on adjacent wafers having resistivity uniformity and thickness uniformity at least of the same quality as in the lower capacity prior art reactors.

The increased batch size and the uniformity of the epitaxial layers are achieved by a unique set of conditions which I discovered yield epitaxial thicknesses and resistivities of at least as good quality as in the prior art, but which involve the use of a different reactor geometry, a different heat source, and different forced air cooling. Further, the larger heat source and the larger reaction chamber have been utilized within the housing of the prior art reactor and yet the uniformity of epitaxial layers grown in the new reactor is essentially indistinguishable from the uniformity of the original reactor. This result is in sharp contrast to previous means for increasing the batch capacity of the prior art barrel epitaxial reactor.

In one embodiment, a reaction chamber having a flat zone 25-50% greater than the flat zone of the prior art reactor and a radiant energy heat source for providing a uniform temperature distribution over the larger flat zone are contained within the housing of the prior art epitaxial reactor. The radiant energy heat source comprises banks of lamps which produce radiant energy in the short wavelength region, i.e., approximately 1 micron or below. Each bank of lamps includes a column of lamps with a highly polished reflector. The energy output of each lamp in the bank is directly proportional to the voltage applied to the lamp.

To achieve a uniform temperature across the flat zone of a susceptor in the reaction chamber, the heat source is about 15-30% longer than the flat zone. The voltage applied to the lamps is such that the energy output of the lamps over the length of the flat zone is approximately uniform and the energy output from the lamps in regions on the column extending beyond the flat zone is in the range of approximately 25-100% greater than the energy output of the lamps over the length of the flat zone. This energy distribution in combination with the geometry of the reaction chamber and the forced air cooling, described below, results in a reactor with an increased batch size having epitaxial layers within industry uniformity standards. In contrast, the energy distribution used to increase the batch size in the prior art resulted in unacceptable uniformity variations.

The reaction chamber of this invention is contained within a bell jar with a smaller transition region than prior art bell jars and a larger vertical wall length relative to the total length of the bell jar. Moreover, the position of the susceptor within the bell jar is raised so that the top of the susceptor is approximately −0.25 to +2.0 inches, and preferably about +0.25 inch, above the top of the reflector used with the heat source. The bell jar and the heat source of this invention are connectable to the gas flow apparatus, the forced air flow supply means, the susceptor rotation means, and the power control electronics of the prior art reactor.

In addition to the larger reaction chamber in the new bell jar and the larger heat source, according to the principles of this invention, the epitaxial reactor of this invention includes a means for coupling the blower of the prior art reactor to a supply plenum which in turn provides forced air flow through the heat source and to a section of the reaction chamber wall beyond an end of the heat source. Thus, forced air flow is established along the wall of the reaction chamber so as to maintain the wall of the reaction chamber at a uniform cold temperature relative to the temperature of the susceptor with the larger heat source of this invention.

According to the principles of this invention, a method for improving the batch capacity of the prior art barrel epitaxial reactor is provided by increasing the reaction chamber size and increasing the radiant heat source so that a uniform temperature is maintained over a larger flat zone in the reaction chamber. In addition, in the method of this invention, the forced air flow from a prior art blower is distributed so that a positive air flow is maintained along the exterior wall of the reaction chamber and consequently the wall is maintained at a uniform cold temperature relative to the temperature of the reaction chamber.

The variation in thickness of the epitaxial layer among adjacent wafers and the variation in resistivity of the epitaxial layer among adjacent wafers processed in the reactor of this invention are the same or better than the variations of the prior art barrel epitaxial reactor and significantly better than the the prior art reactor which utilized a larger portion of the susceptor.

In another embodiment of the invention, an unsymmetric heat source in combination with the new reactor geometry maintains a uniform temperature across flat zones of varying lengths by providing a radiant energy distribution that has three distinct regions. The average energy from the heat source is constant over a first region. The energy from the heat source in a second region that extends from an end of the first region towards the gas inlet is not uniform. In the second region, the energy from the heat source is 25-100% greater than the average energy of the first region. The energy from the heat source in a third region that extends from a second end of the first region towards an end of the reaction chamber opposite the gas inlet is either uniform or non-uniform. In the third region, the energy from the heat source is in the range of 25-60%, preferably about 30%, greater than the average energy of the first region.

In addition to the unsymmetric heat source, in this embodiment, a susceptor of a first size is used for a selected set of wafer diameters and another susceptor of a second size is used for other wafer diameters. The combination of different susceptor sizes and the unsymmetric heat source results in increased batch capacity for all wafer sizes over prior art reactors while maintaining thickness and resistivity uniformities at least as good as the uniformities of prior art reactors.

BRIEF DESCRIPTION OF THE DRAWINGS

FIGS. 5A through 5D illustrate the susceptor of this invention for 125 mm diameter wafers.

DETAILED DESCRIPTION

According to the principles of this invention, prior art barrel epitaxial reactor 10 (FIG. 1A) is reconfigured so as to achieve an increased batch size for 100 mm, 125 mm 150 mm and 200 mm diameter wafers. In a first embodiment, only the batch size for 100 mm, 125 mm and 200 mm diameter wafers is increased. In a second embodiment, the batch size for 150 mm diameter wafers as well as the other diameter wafers is increased.

Figure 1A:
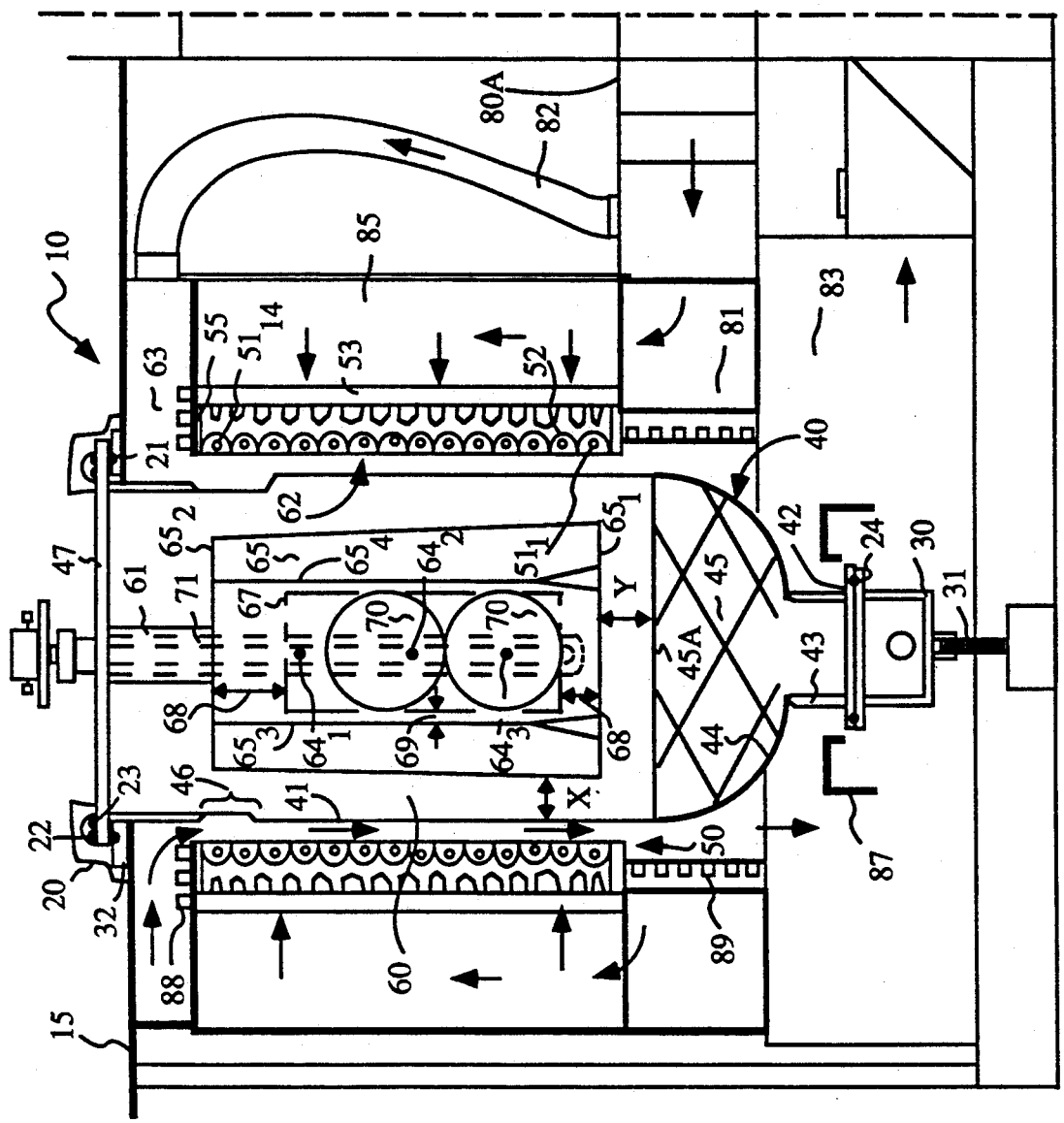
FIG. 1A illustrates a side cross-sectional view of a prior art epitaxial barrel reactor.
Figure 2A:
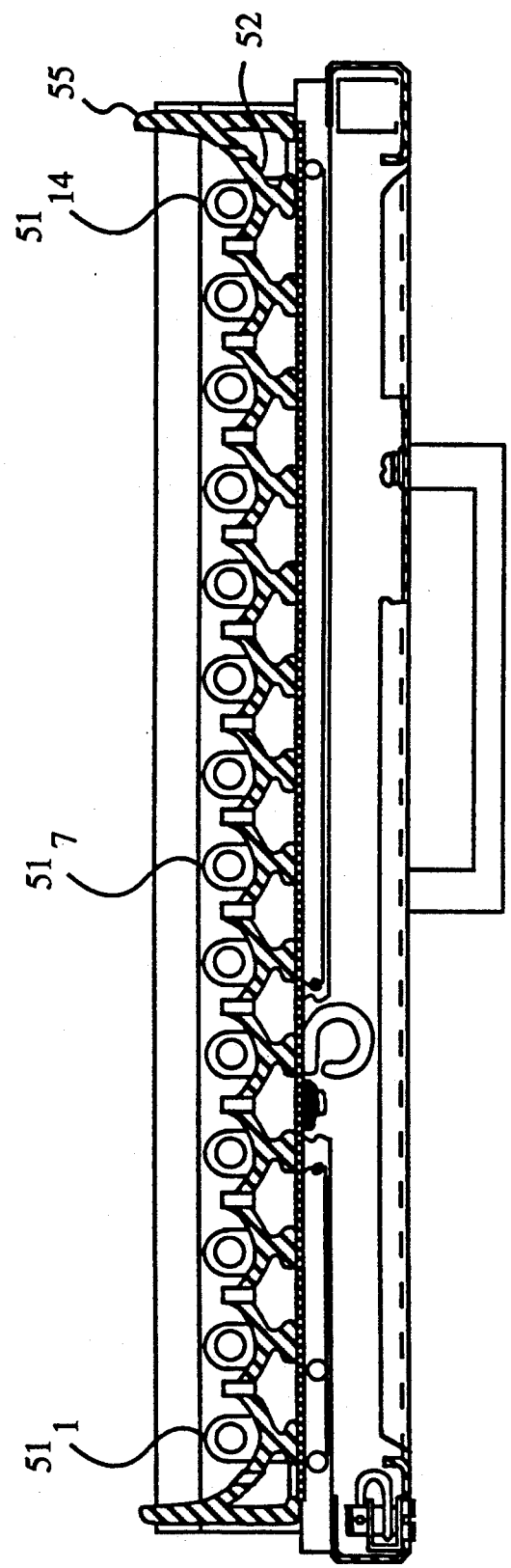
FIG. 2A illustrates a bank of quartz halogen lamps used in the prior art epitaxial barrel reactor of FIG. 1.
Figure 2B:
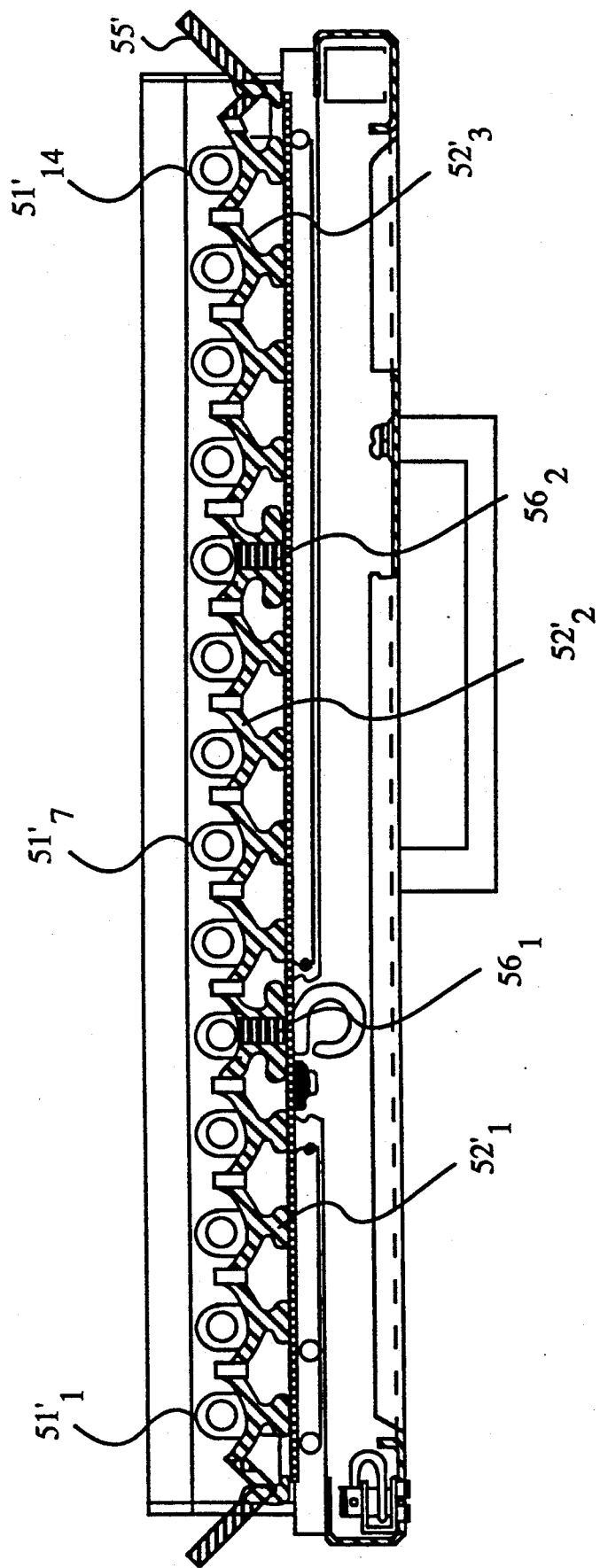
FIG. 2B illustrates a bank of a modified heat source used in the epitaxial barrel reactor of FIG. 1 so as to increase the capacity of that reactor.

Unlike the prior art modification illustrated in FIG. 2B, which was used to increase the batch size and which resulted in poor resistivity uniformity, the epitaxial barrel reactor according to the principles of this invention provides epitaxial layers on adjacent wafers having the same, or better, resistivity uniformity as reactor 10 (FIG. 1A) and having at least the same quality thickness uniformity as reactor 10. The increased batch size and epitaxial layer uniformity within industry standards are obtained with a reaction chamber geometry, heat source, and forced air cooling which provide a unique set of conditions for growth of epitaxial layers.

Since the epitaxial reactor of this invention maintains the epitaxial layer within industry quality standards for increased batch sizes, processing cost per wafer is reduced. Further, since many parts of reactor 10 are reused in the epitaxial reactor of this invention, the overhead costs associated with the reactor of this invention are minimized.

The enhanced batch capacity of this invention is achieved with a flat zone 167 (FIG. 3A) which is up to about 50% greater than the flat zone of reactor 10 (FIG. 1A). Moreover, reaction chamber 160 (FIG. 3A), which contains the 25-50% greater flat zone 167 of epitaxial reactor 100 of this invention (FIG. 3A), is contained within housing 15 of prior art reactor 10 (FIG. 1A).

Unlike the prior art technique for expanding the flat zone using heat source 50' (FIG. 2B), which increased the power density at the edges of the flat zone and decreased the power density at selected regions within the flat zone, I have discovered that by providing a continuous heat source 150 across flat zone 167 of this invention, the average power density absorbed by flat zone 167 can be made approximately uniform. Since flat zone 167 is increased by 25-50%, a heat source 150, which is in the range of 10-40% larger than prior art heat source 50, is contained in reactor 100 of this invention so that a uniform temperature is maintained across flat zone 167. Further, the temperature of wall 141, the heat losses and the reflected heat energy in reactor 100 are maintained so that larger heat source 150 provides the uniform temperature across larger flat zone 167 without degrading the performance of other components in reactor 100.

Hence, according to the principles of this invention, a larger heat source 150, a larger susceptor 165, and a larger reaction chamber 160 are used in a confined volume, housing 15, to provide a larger batch capacity with excellent uniformity. In contrast, as previously described, the prior art attempts to use a larger heat source 50' within housing 15 resulted in unacceptable variations in epitaxial layer resistivity. Prior art heat source 50' did not have a uniform energy output over the larger flat zone because spacers 56 were added to the heat source.

To achieve the enhanced batch capacity, in a first embodiment, the prior art 16.75 inch susceptor 65 (FIG. 1A) was replaced with a 21.5 inch graphite susceptor coated with silicon carbide. Alternatively in the first embodiment, the prior art susceptor 65 is replaced with a 19.25 inch graphite susceptor coated with silicon carbide. As explained previously, susceptors are identified by the vertical length of the flat zone and the overall vertical length of the susceptor. If a single dimension is given for a susceptor, the dimension is the overall length of the susceptor. In these embodiments, the vertical dimension is defined as the direction extending from the gas entrance of the reaction chamber, i.e., a first end of the reaction chamber, to the gas exit of the reaction chamber, i.e., a second end of the reaction chamber, opposite to the first end.

While in the embodiments of this invention a one piece graphite susceptor was used, susceptor 165, as described more completely below, can be made from any material that (i) absorbs radiant energy from heat source 150, (ii) provides a uniform surface temperature, and (iii) does not contaminate wafers 70.

Heat source 50 of reactor 10 was replaced with a new heat source 150, bell jar 40 with new bell jar 140 and quartz hanger 61, upper plenum 63, vertical riser 85, and exhaust plenum 83 of reactor 10 were replaced by quartz hanger 161, upper plenum assembly 163, vertical riser 185 and exhaust plenum 183, respectively.

In addition, an air flow deflector 188 was placed at the inlet of pipe 82 in supply plenum 81. Outlet 80A of blower 80 was lowered by a distance of approximately 1.5 inches and a transition duct 179 couples outlet 80A of blower 80 with supply plenum 81.

The above-mentioned new components of reactor 100 are included in the package of this invention for reconfiguring prior art reactor 10 so as to increase the batch capacity. As described more completely below, in one embodiment of reactor 100 of this invention, susceptor 165, heat source 150, bell jar 140, upper plenum 161, vertical riser 185 and exhaust plenum 183 are contained within housing 15 so that gas ring 20, rotation means for susceptor 165, supply plenum 81, heat exchanger 84, cooling plate 88, water cooled wall 89, guard ring 87, blower 80 and the other electrical and control components of prior art reactor 10 can be utilized.

Since susceptor 165 (FIG. 3A) is up to 4.75 inches longer than susceptor 65 of reactor 10 (FIG. 1A), a longer heat source 150 (FIG. 3A) is required to provide a source of uniform radiant heat energy across flat zone 167. As explained more completely below, heat source 150, in the first embodiment is about 4.5 inches longer than heat source 50 of reactor 10 (FIG. 1A), while in the second embodiment, heat source 150A (FIG. 5A) is about 5.7 inches longer than heat source 50.

To mount heat source 150 within housing 15 required a reduction in the height of both exhaust plenum 183, and upper plenum assembly 163. Specifically, upper plenum 163 was shortened by one inch, and exhaust plenum 183 was shortened by 3.5 inches in the first embodiment and exhaust plenum 183A (FIG. 6A) was shortened by 4.2 inches in the second embodiment. The volume of upper plenum 163 and the volume of exhaust plenum 183 were reduced, but heat source 150 was increased. Therefore, the forced air cooling of the reaction chamber 160, as described more completely below, has been changed in comparison to prior art reactor 10.

Figure 3A:
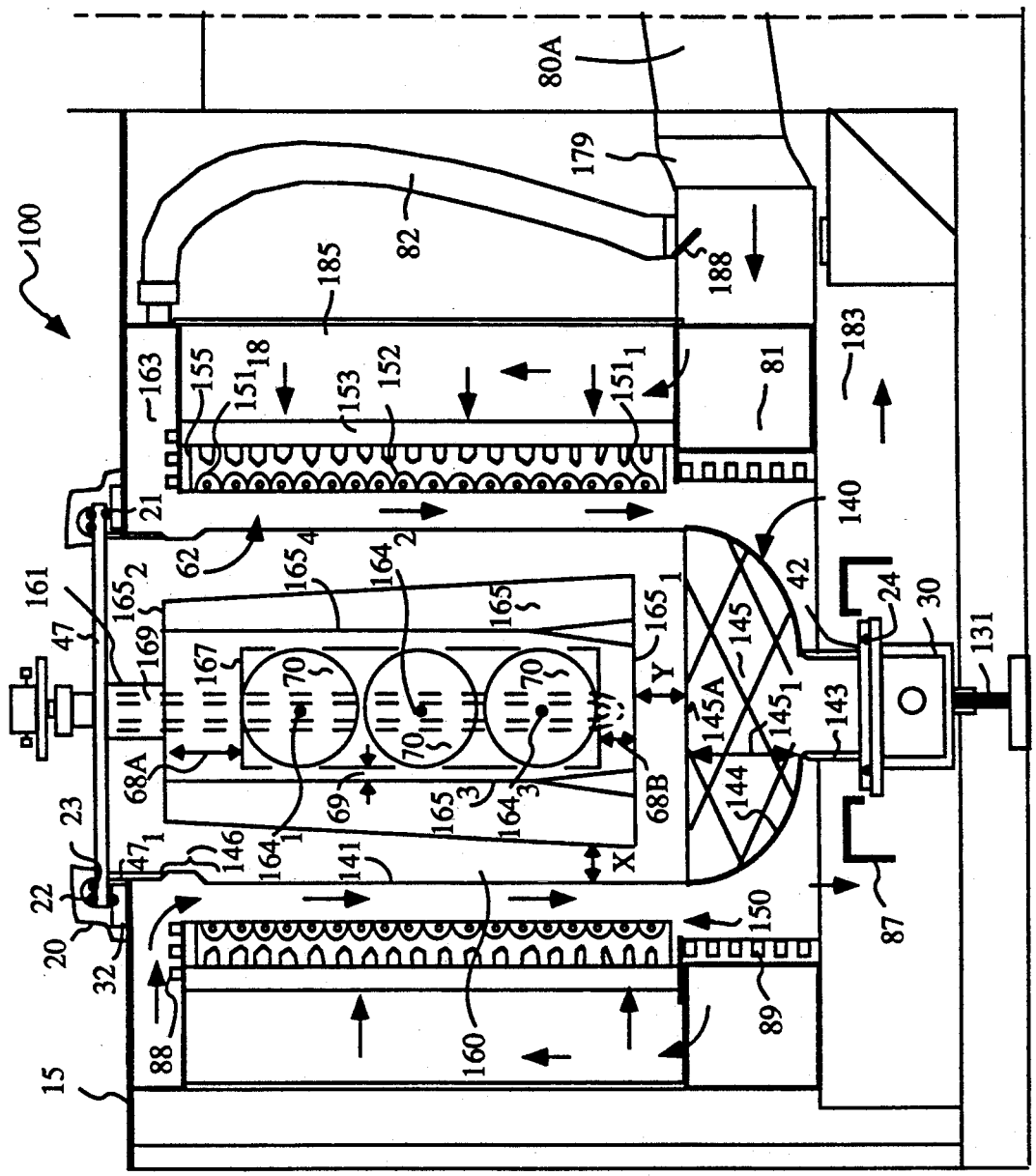
FIG. 3A illustrates a side cross-sectional view of one embodiment of an epitaxial barrel reactor according to the principle of this invention.

Spacings X and Y, as illustrated in FIG. 3A, are maintained between susceptor 165 and the boundaries of reaction chamber 160. Spacing X is in the range of approximately 1.8 inches to 2.5 inches and spacing Y is in the range of approximately 1 inch to 3 inches. Since susceptor 165 is up to 4.5 inches longer than the prior art susceptor, reaction chamber 160 must also be about 4.5 inches longer so that spacing Y is maintained between bottom $165_1$ of susceptor 165 and the bottom of reaction chamber 160. Therefore, bell jar 40 of reactor 10 could not be used in this invention and a new bell jar 140 was required. The new bell jar changes the geometry of reaction chamber 160, as described below. As previously described, changes in reaction chamber geometry directly affect the conditions required for uniform growth of epitaxial layers within the chamber. The gas dynamics, as previously described, the heat losses, and possibly the temperature profile within the bell jar are changed.

Bell jar 140, which has approximately a 14 inch outer diameter, is 1.1 inches longer than prior art bell jar 40 of reactor 10 (FIG. 1A). Support assembly 131 was modified so that bell jar 140 is properly positioned within housing 15. Also, approximately one inch was removed from flange $47_1$ of opaque top flange 47. Vertical support 143 is connected to flange 42 and O-ring 24 provides a seal between flange 42 and exhaust cup 30.

Increasing the length of bell jar 140 by 1.1 inches is not sufficient to increase the length of reaction chamber 160 by about 4.5 inches. Thus, transition zone 146 was reduced from three inches in reactor 10 (FIG. 1A) to 1.5 inches in reactor 100 (FIG. 3A). The 1.1 inch longer length of jar 140 plus the 1.5 inches eliminated from transition region 146 provides 2.6 inches of the required 4.5 inches. An additional 0.5 inch was obtained by reducing the length of lower vertical support 143 for bell jar 140. These changes provided 3.1 inches of the additional 4.5 inches in length needed for reaction chamber 160.

The additional 1.4 inches required for reaction chamber 160 were achieved (i) by moving susceptor 165 up in bell jar 140 and (ii) by moving bead-blasted area 145 down so as to maintain the distance Y between bead-blasted area 145 and bottom $165_1$ of susceptor 165. Specifically, hanger 161 suspends susceptor 165 in bell jar 140 so that top $165_2$ of susceptor 165 is approximately −0.25 to 2.0 inches, preferably about 0.25 inches, above top 155 of reflector 152. Bead-blasted area 145 was moved down so that a vertical distance $145_1$ from vertical support 143 to line 145A was about one inch less than the corresponding distance in reactor 10 (FIG. 1A).

Hence, reactor 100 of this invention required development of a new bell jar 140 with a smaller transition region 146 and a longer predetermined vertical wall length 141 relative to the total length of bell jar 140. The relationship of susceptor 165 within bell jar 140 was also changed Therefore, not only were the boundary conditions at the top and bottom of the reaction chamber 160 modified by moving the top and bottom closer to housing 15, but also the configuration of reaction chamber 160 within bell jar 140 was modified. Therefore, while reactor 100 (FIG. 3A) is somewhat similar in appearance to reactor 10 (FIG. 1A), the boundary conditions as well as the relationship between reaction chamber 160, susceptor 165 and heat source 150 have been modified to achieve the enhanced performance of reactor 100.

Figure 3B:
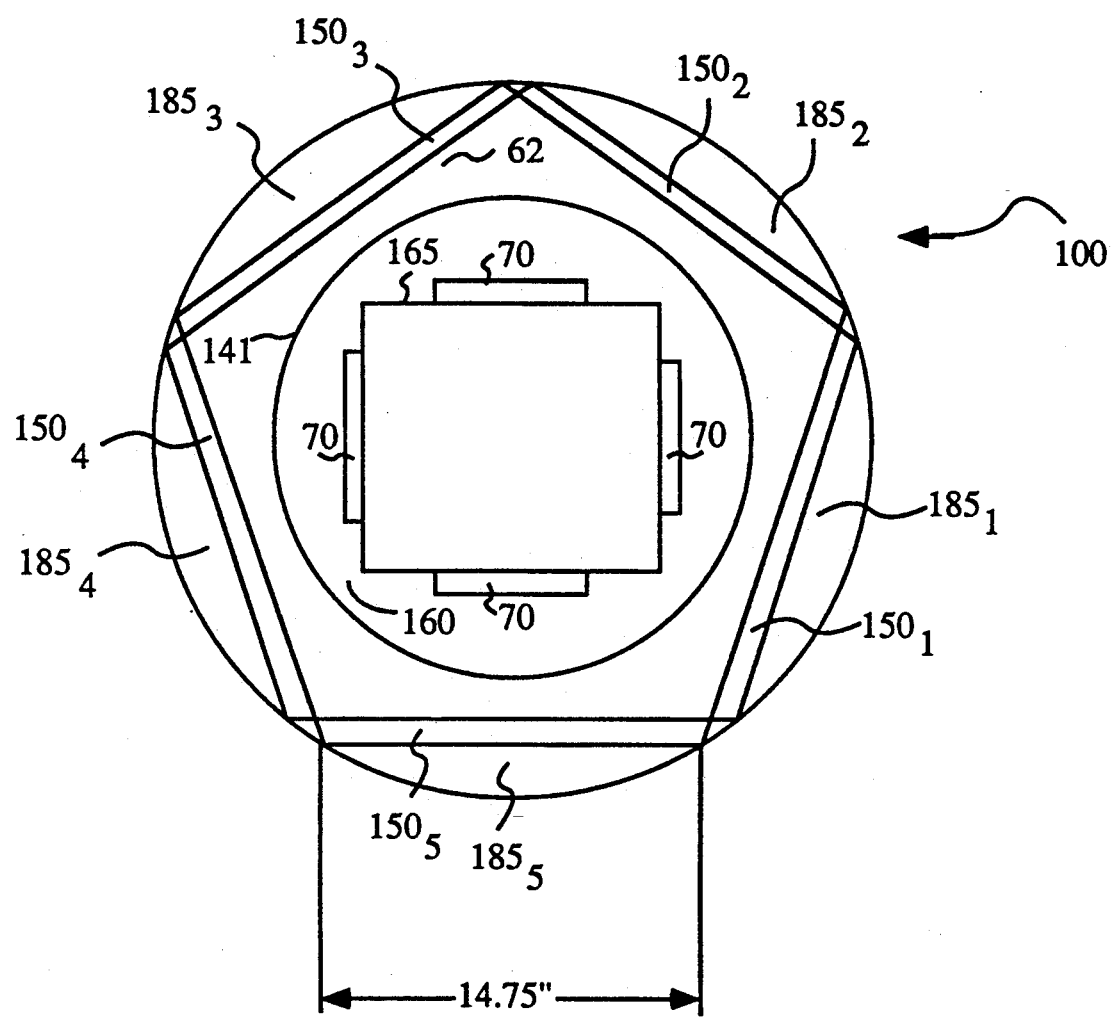
FIG. 3B illustrates a horizontal cross-sectional view of the banks of lamps in the first heat source of this invention and the reaction chamber of this invention.

Heat source 150, in this embodiment, consists of five banks of quartz halogen lamps 151. The five banks of lamps in heat source 150 form a pentagon about bell jar 140 (FIG. 3B). In FIG. 3B, only the five banks of lamps and bell jar 140 are illustrated in the horizontal cross-sectional view for clarity. The horizontal width of each column, as shown in FIG. 3B, is approximately 14.75 inches. The outside diameter of reaction chamber 160 is approximately 14 inches.

In the first embodiment, each of the five banks of heat source 150 has eighteen lamps 151. As illustrated in FIG. 3A, each bank of lamps in heat source 150 forms a column that is separated from an exterior surface of wall 141 of reaction chamber 160 by region 62. The vertical length of the column of lamps 151, as illustrated in FIG. 3A, is about 25% greater than the length of flat zone 167. Specifically, in this embodiment, flat zone 167 is 16.5 inches (41.15 cm) in length, and each bank of lamps 151 is about 20.25 (18 lamps × 1.125 inches/lamp) inches (51.44 cm) in length. As previously described, the vertical dimension is defined as the dimension in the direction extending from the gas entrance to chamber 160 to the gas exit to chamber 160.

Each of lamps 151 is a quartz halogen lamp with a tungsten filament that produces radiant energy in the short wavelength range, i.e., approximately one micron or below. One source of lamps suitable for use in this invention is sold under Model No. QIR 480-6000E by Ushio American, Inc. of Torrance, Calif. 90502. The specifications for these lamps are shown in Table 3.

TABLE 3

| Specification for Radiant Energy Lamps 151 | | | | | |
|---|---|---|---|---|---|
| Design Volts (v) | Design Watts (W) | Color Temp. (°K.) | Maximum Overall Length (mm) | Maximum Light Length (mm) | Bulb Diameter (mm) |
| 480 | 6,000 | 3,150 | 300 | 248 | 11 |

Each lamp 151 is mounted in a 1.125 inch (2.858 cm) parabolic gold plated highly polished reflector. A reflector assembly suitable for use in this invention is available from Vector Technical Group, Inc. of Santa Clara, Calif., and is sold under the name of Spiral-Array Reflector Extended and part number 85815.

As previously described, the radiant energy from each lamp 151 is directly proportional to the voltage across the lamp. As illustrated in Table 4, in the first embodiment, a higher voltage is applied to lamps $151_1$–$151_3$ and $151_{16}$–$151_{18}$ on the upper and lower periphery respectively of reaction chamber 160. Unexpectedly, the expansion of chamber 160, placement of susceptor 165 and placement of heat source 150 closer to housing 15 did not require increasing the voltage applied to the lamps $151_1$, $151_{18}$ by a factor of two over the voltage applied to lamps $151_4$–$151_{15}$ at the center of heat source 150 as suggested by prior art heat source 50' of FIG. 2B.

The outermost lamps $151_1$, $151_{18}$ of each bank have an applied voltage of 350 volts while the four lamps $151_2$, $151_3$, $151_{16}$, $151_{17}$ each have an applied voltage of 300 volts. The remaining twelve lamps $151_4$–$151_{15}$ have an applied voltage of 240 volts. Since heat source 150 in the first embodiment has four more lamps than heat source 50 of reactor 10 (FIG. 1A), heat source 150 has a total energy output approximately 25% greater than heat source 50.

Lamps $151_4$–$151_{15}$, which are about 13.5 inches (34.29 cm) in vertical length, provide a uniform energy output and are centered vertically about the center of flat zone 167. Thus, the average radiant heat energy across flat zone 167 is approximately uniform. The energy from lamps $151_1$–$151_2$ and $151_{17}$–$151_{18}$ is applied to the portions of susceptor 165 below flat zone 167 and above flat zone 167, respectively. Also, lamps $151_3$ and $151_{16}$ provide energy to the lower and upper boundary respectively of flat zone 167. The energy output of each of these lamps $151_1$-$151_3$ and $151_{16}$-$151_{18}$ is in the range of 25%-50% greater than the energy output of each of lamps $151_4$-$151_{15}$. Thus, the average energy output of heat source 150 in the regions of heat source 150 which extend beyond flat zone 167 is approximately 25-50% greater than the average energy output of heat source 150 over flat zone 167.

The higher energy output from lamps $151_1$-$151_3$ and $151_{16}$-$151_{18}$ compensates for heat losses from susceptor 165 so that the temperature distribution across flat zone 167 is uniform. Heat source 150 of this embodiment maintains the surface temperature of susceptor 165 in the range of 900°-1200° C. and preferably 1100° C.±5° C.

TABLE 4

| Voltage Distribution for Each Bank of Heat Source 150 | | | |
|---|---|---|---|
| Lamp No. | Voltage | Lamp No. | Voltage |
| $151_1$ | 350 | $151_{10}$ | 240 |
| $151_2$ | 300 | $151_{11}$ | 240 |
| $151_3$ | 300 | $151_{12}$ | 240 |
| $151_4$ | 240 | $151_{13}$ | 240 |
| $151_5$ | 240 | $151_{14}$ | 240 |
| $151_6$ | 240 | $151_{15}$ | 240 |
| $151_7$ | 240 | $151_{16}$ | 300 |
| $151_8$ | 240 | $151_{17}$ | 300 |
| $151_9$ | 240 | $151_{18}$ | 350 |

Unlike prior art heat source 50' of FIG. 2B, which increased the energy at the periphery of the heat source and decreased the energy at two regions in the interior of the heat source, heat source 150 is uniform across the interior and increases at the periphery. Further, in this embodiment the energy output of lamps at the periphery of heat source 150 is less than 50% greater than the energy output of lamps at the interior of heat source 150 and not 100% greater as in heat source 50' (FIG. 2B).

Hence, heat source 150 of this invention in combination with the new reactor geometry maintains a uniform temperature across the flat zone without increasing the energy supplied to the periphery of the susceptor. Such a result is unexpected, because, as previously described, an increased flat zone requires a larger susceptor which in turn requires a larger reaction chamber. A larger reaction chamber results in the boundaries of the reaction chamber being closer to housing 15, and heat source 150 must maintain the temperature differential between reaction chamber 160 and housing 15 even though the resistance to heat losses are decreased by the increased size of reaction chamber 160.

Figure 1B:
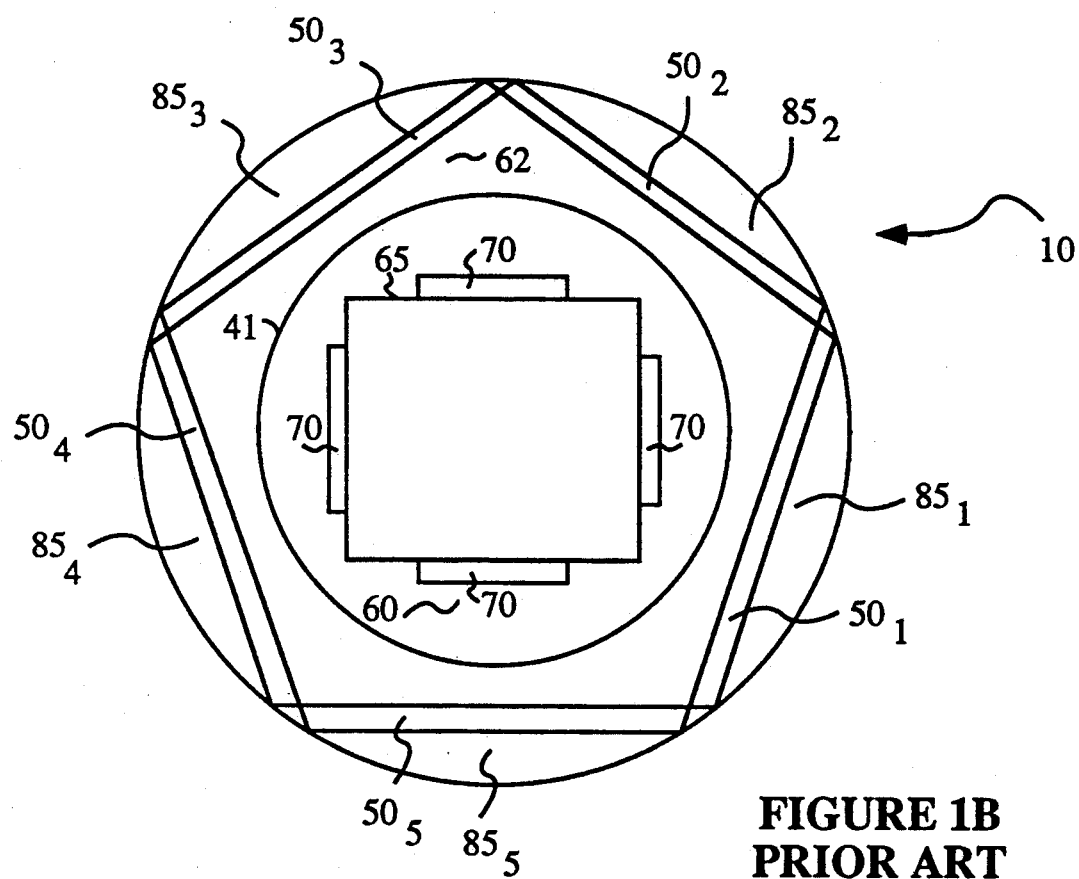
FIG. 1B illustrates a horizontal cross-sectional view of the banks of lamps in the heat source and the reaction chamber of the prior art epitaxial barrel reactor.

Each bank of lamps 151 in heat source 150 in the first embodiment is separated into three groups: a first group consisting of lamps $151_1$-$151_5$; a second group consisting of lamps $151_6$-$151_{13}$; and a third group consisting of lamps $151_{14}$-$151_{18}$. Recall that for reactor 10 in FIG. 1, three silicon controlled rectifiers were used to drive the three groups of lamps in each bank of heat source 50. These three silicon controlled rectifiers are also used with the three groups of lamps 151, as defined above.

Figure 4:
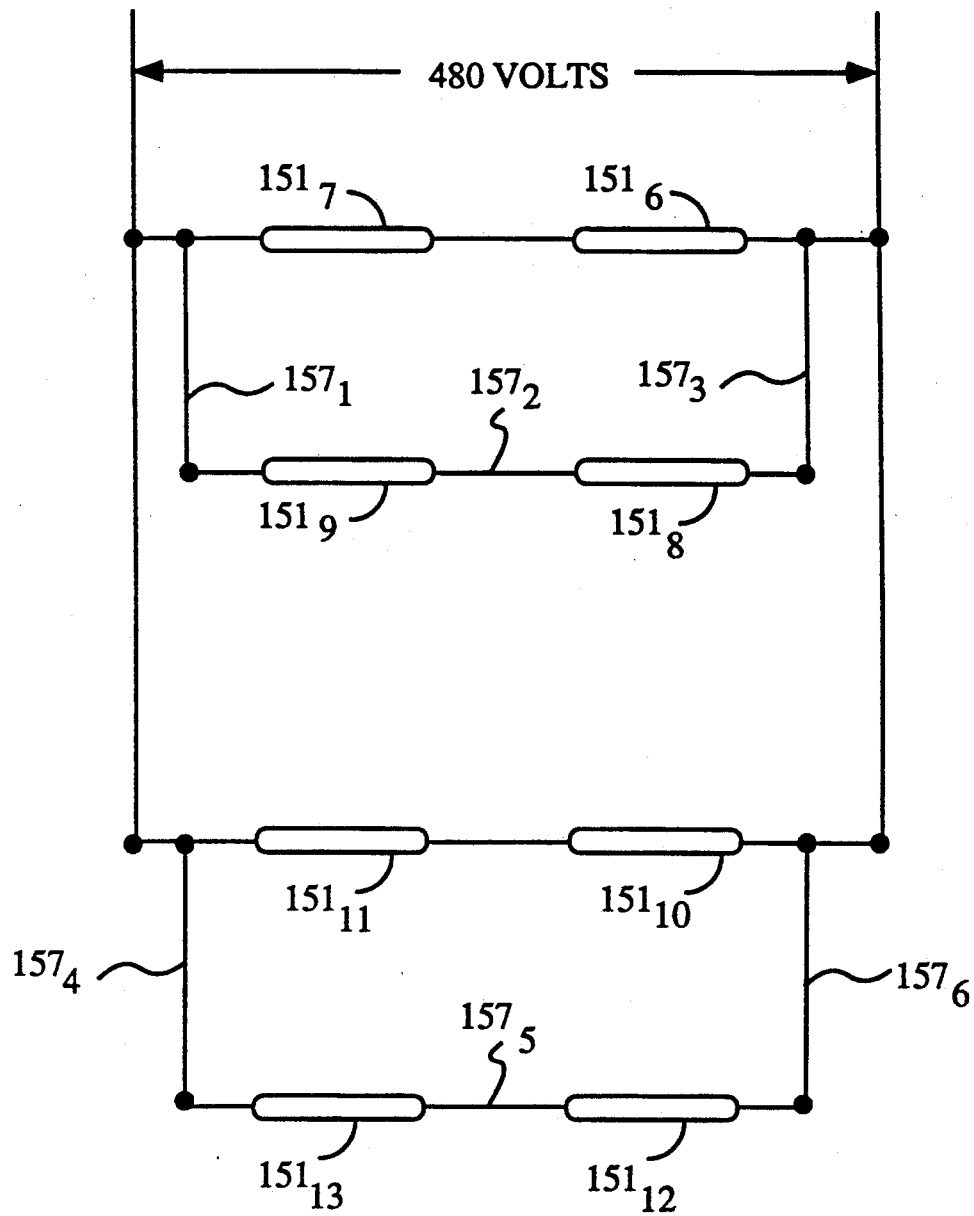
FIG. 4 is a wiring diagram for the second group of lamps in each bank of one embodiment of the heat source of this invention.

Since the power of the first and third groups of lamps 151 in reactor 100 of this invention and in prior art reactor 10 are the same, no modification in the SCR circuitry was required. To connect the second group of eight lamps to the SCR required wiring lamps $151_6$-$151_{13}$ in a series parallel combination, shown in FIG. 4, so that the wiring from the second group of lamps was directly connectable to the prior art fourteen pin connectors. This wiring is performed on the lamp modules using jumpers 157 so that lamps $151_6$-$151_{13}$ can be coupled directly to the original connectors of reactor 10. Further, the second SCR, as previously described, had a lower power utilization, so that the SCR can accommodate the load associated with the additional lamps.

Quartz hanger 161 of this invention also includes a sheath with a path 169 for insertion of an infrared sensor so that the sensor can be positioned at three locations 164 within susceptor 165. Each of the three locations permits measurement of the radiant energy from one of the three groups of lamps in a bank of lamps as defined above. The infrared sensor is the same as the sensor used with reactor 10 (FIG. 1A) except in this invention the sensor has been 165 lengthened so that the larger vertical distance of susceptor can be traversed. The infrared sensor is connected to the closed loop temperature control system that was used in prior art reactor 10 so that the voltage to each group of lamps in a bank can be controlled. Hence, the total radiant energy output of heat source 150 of this invention has been increased by over 25% relative to heat source 50 of reactor 10 (FIG. 1), but heat source 150 (FIG. 3) is directly connectable to the prior art voltage controller and circuitry so that no additional connections or hardware are required to accommodate larger heat source 150.

Side wall 141 of quartz bell jar 140, which is about 3 millimeters thick in one embodiment, is transparent so that the radiant energy from heat source 150 passes through the wall and is incident directly upon susceptor 165. While in this embodiment side wall 141 is quartz, which absorbs little or no radiant heat energy from source 150, any material, which absorbs little or no radiant heat energy and which can withstand temperatures of about 600° C., can be used to form reaction chamber wall 141. Susceptor 165 is rotatably connected to the rotation means of the prior art reactor by quartz hanger 161 so that no modifications are required to the rotation means.

A different susceptor is used for each wafer size. Specifically, for 125 mm diameter wafers, a six-sided susceptor is used. For 100 mm diameter wafers, either a seven- or eight-sided susceptor is used. For 150 mm diameter wafers, a five-sided susceptor is used, and for 200 mm diameter wafers, a four-sided susceptor is used. Herein, the number of sides given for a susceptor does not include the top and bottom sides of the susceptor.

The important factors for all susceptors of this invention are (i) that first selected distance 69 from any substantially vertical edge of the susceptor to a wafer pocket, as described above, is at least 0.1 inches and (ii) that second selected distances 68A, 68B are chosen, as described more completely below, such that the surface temperature of the susceptor is approximately uniform along the vertical length of the flat zone.

A top view, side view and bottom view of susceptor 165 of this invention are illustrated in FIGS. 5A through 5C, respectively. Length L is the vertical length of susceptor 165, i.e. the distance from top surface $165_2$ to bottom surface $165_1$. Susceptor 165 has a multiplicity of external surfaces, for example six surfaces as in FIG. 5A, 5B and 5C, extending from top surface $165_2$ to bottom surface $165_1$. The external surfaces are orientated about the perimeters of top surface $165_1$ and bottom surface $165_2$. Each surface is a face of susceptor 165, sometimes referred to as a side. Susceptor 165, as previously described, has a varying number of faces depending on the wafer size. Similarly the number of wafer pockets 166 on a face depends on the wafer size. Two adjacent faces intersect at an edge, such as edge $165_6$.

Susceptor 165 slopes outward, i.e., towards the reaction chamber wall, from top $165_2$ to bottom $165_1$ by about 1°30' to about 2°50' so that the cross-sectional width of bottom $165_1$ is larger than the cross-sectional width of top $165_2$. For example, the six-sided susceptor for 125 mm diameter wafers has a slope, a face angle, of about 2°32'20". However, the bottom portion of susceptor 165 is trimmed so as to maintain spacing X between susceptor 165 and wall 141 in the range of about 1.8 inches to 2.5 inches. Thus, edges $165_6$, $165_7$, $165_8$, $165_9$ as well as the corresponding edges on other faces of susceptor 165 are only substantially vertical and substantially perpendicular to top surface $165_2$ and bottom surface $165_1$.

If the wafer diameter is D, spacing L1 between centers of wafer pockets 166 is $D+\Delta x1$ where $\Delta x1$ is in the range of 0.06 to 0.2 inches. Spacing L2 from bottom $165_1$ of susceptor 165 to the center of the wafer pocket adjacent to bottom $165_1$ is $0.5D+\Delta x2$ where $\Delta x2$ is in the range of 0.9 to 2.0 inches. Typically, spacing L2 is experimentally determined so that the wafer in the pocket does not have detectable crystalographic slip in any portion of the wafer more than one millimeter from the circumferential edge of the wafer, e.g., a 125 mm diameter wafer must have a 123 mm diameter region with no detectable crystalographic slip.

Spacing L3 from top $165_2$ of susceptor 165 to the center of the wafer pocket adjacent to top $165_2$ is $0.5D+\Delta x3$ where $\Delta x3$ is in the range of 1.1 to 4.0 inches. Spacing L3 is also experimentally determined so that the wafer in the pocket does not experience detectable crystalographic slip in any portion of the wafer more than one millimeter from the circumferential edge of the wafer. Further, spacing L3 is chosen so that the gases used in the deposition process are preheated to a temperature sufficient to insure proper reaction when the gases reach the wafer closest to top $165_2$.

The cutaways of susceptor 165 in FIG. 5B show lips 168 and 169 which are used for connecting top plate 170 (illustrated in top view of FIG. 5A) and bottom plate 171, illustrated in the bottom view of FIG. 5C) respectively, to susceptor 165. Each face of susceptor 165, in this embodiment, is about 0.20 inches thick, and the pockets are about 0.045 inches deep. A cut-away view of a pocket is presented in FIG. 5D. Pockets 166 are not shown in top view 5A for clarity.

In addition to a uniform heat source, such as that applied by source 150, the rotation of susceptor 165, and the positioning of wafers 70 on susceptor 165, the correct operation of reactor 100 requires (i) that wall 141 of bell jar 140 remain at a cold temperature relative to the temperature of susceptor 165 and (ii) that the temperature of wall 141 be approximately uniform. If the temperature of wall 141 increases or is not uniform, the wall boundary conditions on reaction chamber 160 change, which in turn, as previously described, causes growth of epitaxial layers which are not uniform. Therefore, the forced air circulation must compensate for the larger heat source 150 and must maintain wall 141 at a cold uniform temperature relative to the temperature of susceptor 165.

Blower 80, in one embodiment, rotates at about 3,450 revolutions per minute and provides an air flow of from about 8,000 to about 15,000 cubic feet per minute to supply plenum 81. Supply plenum 81 has a vertical riser 185 which is connected to heat exchanger 153 mounted on the back of lamp assemblies 150. Thus, air in supply plenum 81 is passed through heat exchanger 153 on the back of lamp assemblies 150 through reflector 152 and around lamps 151 into region 62 between bell jar wall 141 and lamp assemblies 150. In FIG. 3A, the air flow is represented by arrows without a reference numeral.

However, the pressure difference created by the resistance to air flow through lamp assembly 150 does not provide sufficient air flow to plenum region 161 to maintain a positive air flow down wall 141 of jar 140. Accordingly, air scoop 188 is provided in supply plenum 81 at the inlet of two-inch outer diameter pipe 82 so that a fraction of the air from blower 80 is diverted directly into pipe 82 and subsequently to upper plenum region 161.

Thus, forced air flow from region 161 and from vertical riser 185 flows down the surface of side wall 141, which is exterior to reaction chamber 160, into exhaust plenum 183. The air passes through exhaust plenum 183 into heat exchanger 84. The temperature of the return air to heat exchanger 84 is in the range of approximately 90°-105° C. The water flow through heat exchanger 84 has been increased to six gallons per minute by changing the flow restrictor in the water supply line to heat exchanger 84.

The air is cooled as it passes through heat exchanger 84 and the cooled air from heat exchanger 84 passes into blower supply plenum 86. The air temperature of the air provided to blower supply plenum 86 is in the range of approximately 55°-60° C. Hence, not only has heat source 150 been directly coupled to the prior art circuitry but also the forced air cooling has been accomplished using blower 80, heat exchanger 84, and supply plenum 81 of prior art reactor 10. In addition, cooling plate 88 in upper plenum 161 and water cooled wall 89 on supply plenum 81 have not been changed.

Table 5 lists the batch sizes (i) for reactor 10 of FIG. 1A, (ii) for reactor 10 modified to include the heat source of FIG. 2B, (iii) for reactor 100 of this invention with the 21.5 inch susceptor with about a 16.5 inch flat zone, (iv) for reactor 100 of this invention with the 19.25 inch susceptor with about a 16.5 inch flat zone, and (v) for reactor 100A of this invention described more completely below, with a 20.75 inch susceptor having about an 18 inch flat zone for 150 mm diameter wafers and the 19.25 inch susceptor having about a 16.5 inch flat zone for 100 mm, 125 mm and 200 mm diameter wafers.

As shown in Table 5, the variation in resistivity of the epitaxial layer between adjacent wafers processed in reactor 100 of this invention is the same or better than the variations of prior art reactor 10 and significantly better than the variations of reactor 10 using heat source 50' of FIG. 2B The variation in thickness of the epitaxial layer between adjacent wafers in reactor 100 is of the same quality as prior art reactor 10. Hence, a larger heat source and a larger reactor chamber have been utilized within housing 15 of reactor 10 so that the batch size is increased by 100% for 200 mm wafers and yet the uniformity of epitaxial layers grown in the new reactor is essentially indistinguishable from the uniformity of the original reactor. This result is in sharp contrast to previous means for increasing the batch capacity of original reactor 10.

TABLE 5

| System Type | Wafer Diameter | Batch Capacity Thickness Uniformity | Resistivity Uniformity | Batch Size |
|---|---|---|---|---|
| Prior Art Epitaxial Reactor 10 | 100 | 4.5% | 6% | 24 |
| | 125 | 4.5% | 6% | 12 |
| | 150 | 4.5% | 6% | 10 |
| | 200 | ~5.0% | ~7% | 4 |
| Prior Art Epitaxial Reactor 10 with heat source of FIG. 2B | 100 | 4.5% | ~9% | 24 |
| | 125 | ~5.0% | ~30% | 18 |
| | 150 | ~5.0% | ~9% | 10 |
| | 200 | ~5.0% | ~7% | 4 |
| Epitaxial Reactor 100 of this invention with 21.5 inch susceptor | 100 | ~4.5% | ~6% | 32 |
| | 125 | ~4.5% | ~5% | 18 |
| | 150 | ~4.5% | ~5% | 10 |
| | 200 | ~6.0% | ~7% | 8 |
| Epitaxial Reactor 100 of this invention with 19.25 inch susceptor | 100 | ~4.0% | ~6% | 32 |
| | 125 | ~3.8% | ~5% | 18 |
| | 150 | ~4.5% | ~5% | 10 |
| | 200 | ~5.7% | ~7% | 8 |
| Epitaxial Reactor 100A of this invention* | 100 | ~4.0% | ~6% | 32 |
| | 125 | ~3.8% | ~5% | 18 |
| | 150 | ~4.6% | ~5% | 15 |
| | 200 | ~5.7% | ~7% | 8 |

*with a 19.25 inch susceptor for 100, 125 and 200 mm diameter wafers and a 20.75 inch susceptor for 150 mm diameter wafers.

To achieve this uniformity requires adjustment of the gas flows through reaction chamber 160 because reaction chamber 160 of this invention is larger than reaction chamber 60 of prior art reactor 10. For reactor 100 of this invention, which uses the same gas ring and controls as the prior art reactor 10, discussed above, uniform epitaxial layers are grown with typical jet settings on the grid of 3.1 and 3.1, a main hydrogen flow of 107 liters per minute and a rotational hydrogen flow of 72 liters per minute. The flow of the deposition gas, such as trichlorosilane, into reaction chamber 160 must be adjusted to achieve the desired growth rate and process specifications. This adjustment is equivalent to the adjustments required for the prior art reactors and is known to those skilled in the art.

Reactor 100 (FIG. 3A) with 19.25 inch susceptor 165 utilizes more of the surface area of susceptor 165 than was utilized on 16.75 inch (42.54 cm) susceptor 65 of reactor 10. The twelve inch (30.48 cm) flat zone of susceptor 65 left approximately 4.75 inches (12.07 cm) of susceptor 65 unutilized. In contrast, the about 16.5 inch flat zone of 19.25 inch susceptor 165 leaves only approximately 2.75 inches (7 cm) unutilized. Hence, the flat zone of this invention is much closer to the ends $165_1$, $165_2$ of susceptor 165, but yet the uniformity of the epitaxial layers on a much larger batch size is unchanged.

The percentage of the surface area of susceptor 165 covered by wafers 70 further demonstrates the difference between susceptor 165 of this invention and susceptor 65 of prior art reactor 10. For 125 mm diameter wafers, a face of the 19.25 inch susceptor 165 has a surface area of about 101.735 in$^2$ (656.35 cm$^2$). (The surface area of a face of the susceptor does not include the area associated with the trimmed edges at the bottom of the susceptor.) As indicated in Table 5, the batch capacity is 18 wafers and susceptor 165 as indicated above, has six sides. Thus, each face i.e., a side, of susceptor 165 holds three wafers which cover a surface area of about 57.06 in$^2$. The wafers cover about 57% (57.06÷101.735) of the surface area of a face of susceptor 165. In contrast, in prior art reactor 10, only 44%, as described above, of the surface area of susceptor 165 was covered. Therefore, on a susceptor area per wafer basis, susceptor 165 of this invention is smaller that prior art susceptor 65.

The portion of susceptor 165 associated with a wafer is the thermal mass available to maintain the wafer at a uniform temperature. The wafer temperature is a function of the incident radiant energy on the wafer, the thermal mass associated with the wafer, and heat transfer conditions associated with both the wafer and the thermal mass. As the thermal mass of the susceptor associated with a wafer becomes smaller, the thermal inertia of the susceptor associated with a wafer also becomes smaller.

Therefore, in comparison to systems with a larger thermal inertia per wafer, smaller changes in boundary conditions result in temperature changes of the susceptor, because the smaller thermal inertia provides less resistance to temperature changes. Since the wafer is typically at a higher temperature than the susceptor, temperature changes in the susceptor result in a temperature change of the wafer as heat is transferred from the wafer to the susceptor. Thus, to minimize changes in the susceptor temperature, the prior art system required a relatively large thermal mass for each wafer and consequently a large thermal inertia to assure uniform heating of the wafer. In contrast, in the reactors of this invention, uniform heating of the wafer is achieved with a smaller mass per wafer.

For 200 mm diameter wafers, each face of four-sided susceptor 165 has an area of about 158.923 in$^2$ (1,025.31 cm$^2$). As indicated in Table 5, the batch capacity is eight wafers so that each face of susceptor 165 holds two wafers. The two wafers cover about 97.4 in$^2$ of susceptor 165. Thus, the wafers cover about 61% (97.4÷158.923) of the surface area of a face of susceptor 165. In contrast, in prior art reactor 10, as described above, only 36% of the surface area of a face of susceptor 65 was covered. For 100 mm diameter wafers, each face of eight-sided susceptor 165 has an area of about 89.400 in$^2$ (576.77 cm$^2$).

A susceptor performance factor is defined as an alternative way to characterize the susceptor utilization:

$$\text{Performance factor} = \frac{\text{Total susceptor surface area}}{((\text{\# of wafers/batch})(\text{surface area of wafer in contact with susceptor}))}$$

The susceptor performance for reactor 10 with susceptor 65 and reactors 100 and 100A of this invention are given in Table 6. As illustrated in Table 6, according to the principles of this invention, the total surface area of the faces of susceptor 165 ranges from about 3900 cm$^2$ to about 4700 cm$^2$.

TABLE 6

| | Wafer Diameter (mm) | Batch Capacity (wafers) | Area per Wafer (cm$^2$) | Susceptor Area (cm$^2$) | Susceptor Performance | Percent Change |
|---|---|---|---|---|---|---|
| Reactor 10 | 100 | 24 | 78.5 | 4,026.83 | 2.14 | |
| Reactor 100 and 100A | 100 | 32 | 78.5 | 4,614.18 | 1.83 | 14% |

TABLE 6-continued

|  | Wafer Diameter (mm) | Batch Capacity (wafers) | Area per Wafer (cm²) | Susceptor Area (cm²) | Susceptor Performance | Percent Change |
|---|---|---|---|---|---|---|
| Reactor 10 | 125 | 12 | 122.72 | 3,353.99 | 1.78 | |
| Reactor 100 and 100A | 125 | 18 | 122.72 | 3,938.12 | 1.57 | 12% |
| Reactor 10 | 200 | 4 | 314.16 | 3,467.61 | 2.75 | |
| Reactor 100 and 100A | 200 | 8 | 314.16 | 4,101.23 | 1.63 | 41% |
| Reactor 10 | 150 | 10 | 176.63 | 3,744.83 | 2.12 | |
| Reactor 100A | 150 | 15 | 176.63 | 4,611.17 | 1.74 | 18% |

As the susceptor performance becomes smaller, the performance of the susceptor increases in that the area of the susceptor associated with a wafer decreases. Hence, as shown in Table 6, the susceptor performance for the reactors of this invention are in the range of about 10% to about 40% better than the susceptors of the prior art reactors. Therefore, for all wafer diameters on a susceptor area per wafer basis, susceptor 165 of this invention is smaller than prior art susceptor 65.

The first embodiment of this invention used either a 21.75 inch or a 19.25 inch susceptor, both with about a 16.5 inch flat zone 167, and heat source 150 to increase the batch capacity, as described above, for 100 mm, 125 mm and 200 mm diameter wafers. However, the batch capacity for 150 mm diameter wafers was unchanged from prior art reactor 10.

Therefore, a second embodiment of this invention is provided for increasing the batch capacity for 150 mm diameter wafers as well as 100 mm, 125 mm and 200 mm diameter wafers. In the second embodiment, reactor 100A (FIG. 6A) is the same as reactor 100 of the first embodiment with the 19.25 inch susceptor except a different heat source 150A, lower plenum 183A, and another susceptor for 150 mm diameter wafers are used. Each face of the susceptor for 150 mm diameter wafers has an area of about 142.9465 in² (922.23 cm²).

In the second embodiment, an approximately uniform radiant energy output is provided by heat source 150A over flat zone 167, but the radiant energy output is not symmetrical about the vertical center of heat source 150A. This radiant energy distribution is unlike the prior art radiant energy distributions that were symmetrical about the vertical center of the heat source.

Figure 6A:
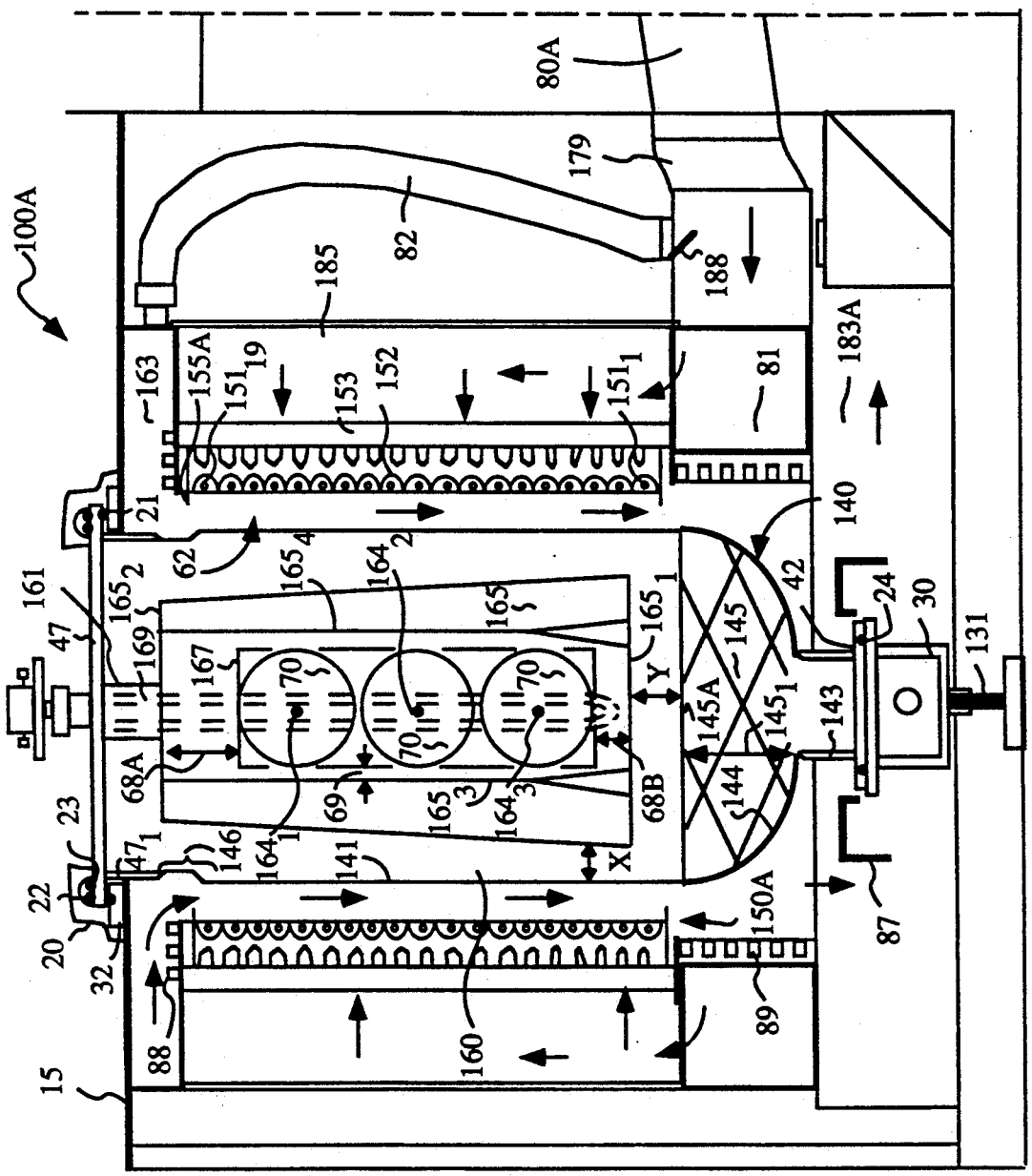
FIG. 6A illustrates a side cross-sectional view of a second embodiment of an epitaxial barrel reactor according to the principles of this invention.
Figure 6B:
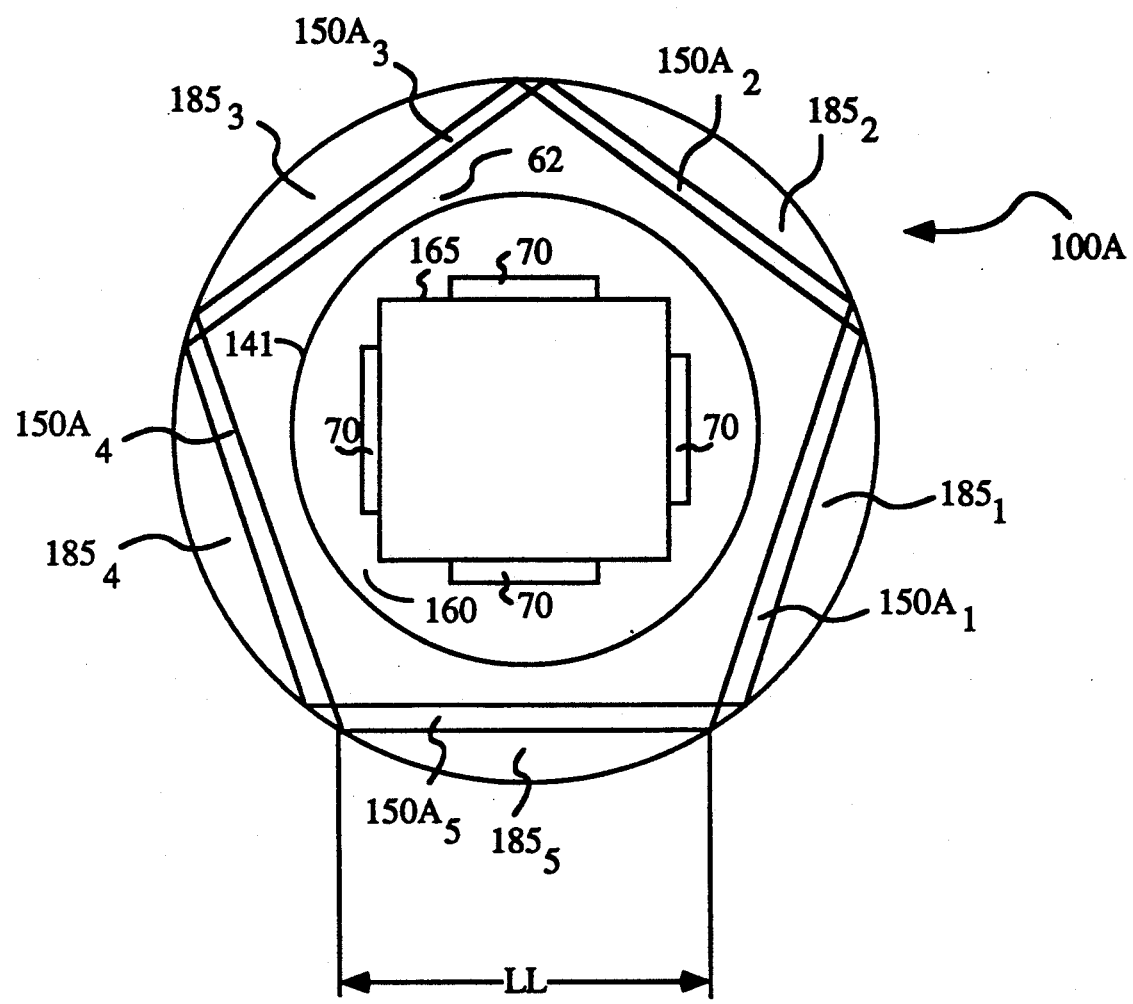
FIG. 6B illustrates a horizontal cross-sectional view of the banks of lamps in the second heat source of this invention and the reaction chamber of this invention.

Heat source 150A, in this embodiment, also consists of five banks of quartz halogen lamps 151. The five banks of lamps in heat source 150A form a pentagon about bell jar 140 (FIG. 6B). In FIG. 6B, only the five banks of lamps and bell jar 140 are illustrated and the horizontal width LL of each column, as shown in FIG. 6B, is approximately 14.75 inches. The outside diameter of reaction chamber 160 is approximately 14 inches.

In the second embodiment, each of the five banks of heat source 150A has nineteen lamps 151. As illustrated in FIG. 6A, each bank of lamps in heat source 150A forms a column that is separated from an exterior surface of wall 141 of reaction chamber 160 by region 62. The vertical length of the column of lamps 151, as illustrated in FIG. 6A, is at least 18% greater than the length of flat zone 167. Specifically, in this embodiment, flat zone 167 is about 16.5 inches in length for 100, 125 and 200 mm diameter wafers and about eighteen inches for 150 mm diameter wafers Each bank of lamps 151 is about 21.375 (19 lamps × 1.125 inches/lamp) inches in length. As previously described, the vertical dimension is defined as the dimension in the direction extending from the gas entrance to chamber 160 to the gas exit to chamber 160.

Each of lamps 151 in heat source 150A is identical to the lamps described above in Table 3. In this embodiment, each lamp 151 is mounted in a 1.125 inch parabolic gold plated highly polished reflector, a spiral array, as in the first embodiment. A reflector assembly suitable for use in this invention is available from Vector Technical Group, Inc. of Santa Clara, Calif., and is sold under the name of Spiral-Array Reflector Extended and part number 85815. However, lip 155A at the top of the reflector assembly, in one embodiment, was shortened by an amount in the range of about 0.1 to 0.3 inches. The shortening of lip 155A permits heat energy from lamp $151_{19}$ to heat the upper regions of the reaction chamber.

As previously described, the radiant energy from each lamp 151 is directly proportional to the voltage across the lamp. As illustrated in Table 7, in the present embodiment, the voltage applied to lamps 151 is not symmetrical about the vertical center of the column of lamps. The first lamp $151_{19}$ of each bank has an applied voltage in the range of about 350 to 480 volts while the next two lamps $151_{18}$ and $151_{17}$ have an applied voltage of about 300 volts. Here, "first" refers to the lamp at the top of reactor 100A. The next fourteen lamps $151_3$–$151_{16}$ have an applied voltage of about 240 volts. Finally, lamps $151_1$–$151_2$ have an applied voltage in the range of 300 to 380 volts, preferably about 310 volts. Since heat source 150A has five more lamps than heat source 50 of reactor 10 (FIG. 1A), heat source 150A has a total energy output more than 25% greater than heat source 50.

For the eighteen inch flat zone used with the 150 mm diameter wafers, the energy from lamps $151_1$ and $151_{18}$–$151_{19}$ is applied primarily to the portions of susceptor 165 below flat zone 167 and above flat zone 167, respectively. Lamps $151_2$ and $151_{17}$ provide some energy to the lower and upper boundary respectively of flat zone 167. The energy output of each of lamps $151_1$–$151_2$ and $151_{17}$–$151_{19}$ is in the range of 25%–100% greater than the energy output of each of lamps $151_3$–$151_{16}$. Thus, the average energy output of heat source 150A in the regions of heat source 150 which extend beyond flat zone 167 is approximately 25–100% greater than the average energy output of heat source 150A over flat zone 167.

The higher energy output from lamps $151_1$–$151_2$ and $151_{17}$–$151_{19}$ compensates for heat losses from susceptor 165 so that the temperature distribution across flat zone 167 is uniform. Heat source 150A of this invention maintains the surface temperature of eighteen inch flat zone 167 in the range of 900°–1200° C. and preferably 1100° C.±5° C.

TABLE 7

Voltage Distribution for Each Bank of Heat Source 150A

| Lamp No. | Voltage | Lamp No. | Voltage |
|---|---|---|---|
| $151_1$ (Bottom) | 310 | $151_{10}$ | 240 |
| $151_2$ | 310 | $151_{11}$ | 240 |
| $151_3$ | 240 | $151_{12}$ | 240 |
| $151_4$ | 240 | $151_{13}$ | 240 |
| $151_5$ | 240 | $151_{14}$ | 240 |
| $151_6$ | 240 | $151_{15}$ | 240 |
| $151_7$ | 240 | $151_{16}$ | 240 |
| $151_8$ | 240 | $151_{17}$ | 300 |
| $151_9$ | 240 | $151_{18}$ | 300 |
|  |  | $151_{19}$ (Top) | 480 |

Unlike the prior art heat source 50' of FIG. 2B, which increased the energy at the periphery of the heat source and decreased the energy at two regions in the interior of the heat source, the energy output of heat source 150A is uniform across the interior and increases at the periphery, but the increases at the periphery are not equal. Therefore, heat source 150A is not symmetric about the vertical center of the heat source in this embodiment.

For the 16.5 inch flat zone, lamps $151_3$-$151_{16}$, which are about 15.75 inches in vertical length, provide a uniform energy output over the majority of 16.5 inch flat zone 167. The energy from lamps $151_1$-$151_2$ and $151_{18}$-$151_{19}$ is applied primarily to the portions of susceptor 165 below flat zone 167 and above flat zone 167, respectively. Heat source 150A of this invention maintains the surface temperature of the 16.5 inch flat zone in the range of 900°-1200° C. and preferably 1100° C.±5° C.

Hence, heat source 150A of this invention in combination with the new reactor geometry maintains a uniform temperature across the flat zones of varying lengths by using a radiant energy distribution that has three distinct regions. The average energy from heat source 150A is constant over a first region. The energy from heat source 150A in a second region that extends from an end of the first region towards the gas inlet is not uniform. In the second region, the average energy from heat source 150A is 25-100% greater than the average energy of the first region. The average energy from heat source 150A in a third region that extends from a second end of the first region towards the gas outlet is uniform, but in another embodiment the energy in this region is not uniform. In the third region, the average energy from heat source 150A is in the range of about 25-60%, preferably about 30%, greater than the average energy of the first region.

Each bank of lamps 151 in heat source 150A is separated into three groups: a first group consisting of lamps $151_1$-$151_6$; a second group consisting of lamps $151_7$-$151_{14}$; and a third group consisting of lamps $151_{15}$-$151_{19}$. Recall that for reactor 10 in FIG. 1, three silicon controlled rectifiers were used to drive the three groups of lamps in each bank of heat source 50. These three silicon controlled rectifiers are also used with the three groups of lamps 151, as defined above.

Figure 7:
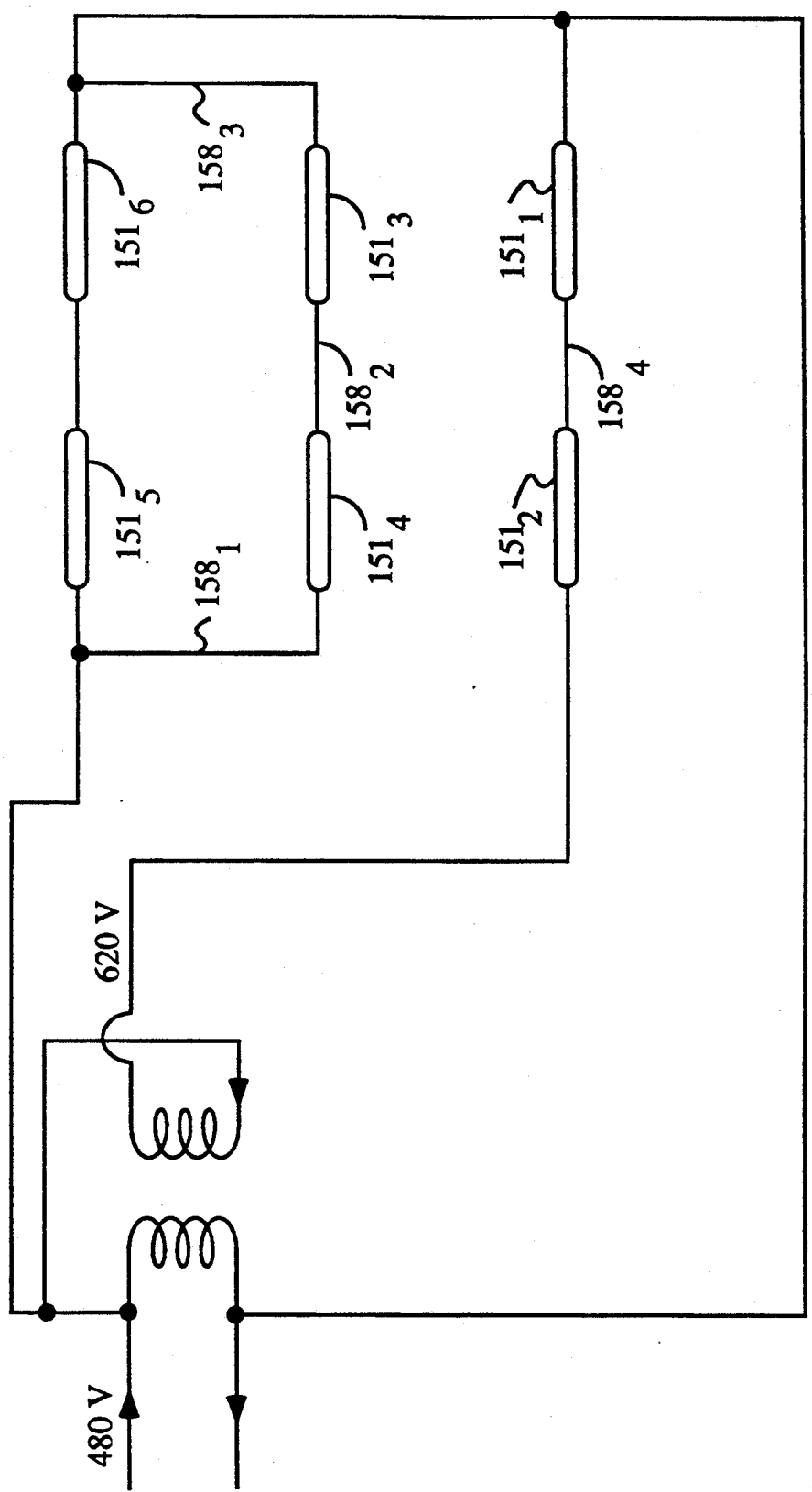
FIG. 7 is a wiring diagram for the first group of lamps in each bank of the second embodiment of the heat source of this invention.

Since the power of the second and third groups of lamps 151 in heat source 150A of reactor 100A are similar to heat source 150 of reactor 100. The second and third groups of lamps in heat source 150A are connected to the SCRs as previously described for heat source 150. To connect the first group of six lamps to the SCR required wiring lamps $151_1$-$151_6$ in a series parallel combination, shown in FIG. 7, so that the wiring from the first group of lamps was directly connectable to the prior art fourteen pin connectors. This wiring is performed on the lamp modules using jumpers 158 so that lamps $151_1$-$151_6$ can be coupled directly to the original connectors of reactor 10.

As shown above in Table 5, the variation in resistivity of the epitaxial layer between adjacent wafers processed in reactor 100A of this invention is the same or better than the variations of prior art reactor 10 and significantly better than the variations of reactor 10 using heat source 50' of FIG. 2B. The variation in thickness of the epitaxial layer between adjacent wafers in reactor 100A is of the same quality as prior art reactor 10. Hence, a larger unsymmetric heat source and a larger reactor chamber have been utilized within housing 15 of reactor 10 so that the batch size is increased by 100% for 200 mm wafers and 50% for 150 mm wafers and yet the uniformity of epitaxial layers grown in the new reactor is essentially indistinguishable from the uniformity of the original reactor. This result is in sharp contrast to previous means for increasing the batch capacity of original reactor 10.

To achieve this uniformity requires adjustment of the gas flows through reaction chamber 160 as described above. For reactor 100A of this invention in one experiment with the 20.75 inch susceptor for 150 mm diameter wafers, uniform epitaxial layers are grown with typical jet settings on the grid of 3.5 and 1.0, a main hydrogen flow of 75 liters per minute and a rotational hydrogen flow of 40 liters per minute. The flow of the deposition gas, such as trichlorosilane, into reaction chamber 160 must be adjusted to achieve the desired growth rate and process specifications. This adjustment is equivalent to the adjustments required for the prior art reactors. Further, as is known to those skilled in the art, the jet settings and hydrogen flows must be adjusted for each individual reactor and may vary between reactors of the same type. Therefore, the settings cited herein are illustrative only and are not intended to limit the invention to the values given.

In the embodiments of this invention described above, the length of the susceptor was increased to provide an increased batch capacity for the epitaxial reactor. The reaction chamber and the heat source were provided so as to maintain industry standards for uniformity of epitaxial layers. In view of the above description, equivalent modifications to other barrel epitaxial reactors using the principles of this invention will be apparent to those skilled in the art. Accordingly, the above embodiments of the invention are descriptive only and are not intended to limit the scope of the invention.

I claim:

1. A cold wall barrel epitaxial reactor for processing a multiplicity of wafers comprising:

a housing, wherein said housing was designed to contain a first reactor chamber means, a first radiant energy heat source means, and a first susceptor having a flat zone of about 12 inches;

second reaction chamber means including susceptor means having a flat zone in the range of greater than 12 inches to about 18 inches in length in a first direction wherein said second reactor chamber means is operatively mounted in said housing; and second radiant energy heat source means, operatively mounted in said housing, for providing an unsymmetrical heat energy distribution about the center of said second radiant energy heat source means in said first direction so that epitaxial layers formed on adjacent wafers in said reaction chamber have a resistivity that varies by less than approximately 10%.

2. The cold wall barrel epitaxial reactor as in claim 1 wherein said second reaction chamber means comprises a structure having a transparent quartz wall.

3. The cold wall barrel epitaxial reactor of claim 1 wherein said second unsymmetric radiant energy heat source means comprises a column of lamps having a first end and a second end wherein the energy output of a first multiplicity of lamps at said first end of said column is different from the energy output of a second multiplicity of lamps at said second end of said column.

4. The cold wall barrel epitaxial reactor of claim 3 wherein at least one lamp at said first end of said column has a higher energy output than the energy output of any other lamp in said column.

5. The cold wall barrel epitaxial reactor of claim 3 wherein each lamp in a third multiplicity of lamps in said column of lamps has approximately the same energy output.

6. The cold wall barrel epitaxial reactor of claim 5 wherein the energy output of each lamp in said first multiplicity of lamps is in the range of about 25% to about 100% greater than the energy output of any lamp in said third multiplicity of lamps.

7. The cold wall barrel epitaxial reactor of claim 5 wherein the energy output of each lamp in said second multiplicity of lamps is in the range of about 25% to about 60% greater than the energy output of any lamp in said third multiplicity of lamps.

8. The cold wall barrel epitaxial reactor of claim 1 further comprising forced air cooling means for maintaining an exterior surface of a wall of said second reaction chamber means at about a uniform temperature.

9. The cold wall barrel epitaxial reactor of claim 8 wherein said forced air cooling means comprises:
blower means for providing forced air flow; and
means, operatively coupled to said blower means, for distributing said forced air flow through said second radiant energy heat source means onto said wall of said second reaction chamber means.

10. The cold wall barrel epitaxial reactor of claim 9, said forced air cooling means further comprising:
means, operatively coupled to said distributing means, for diverting a portion of said forced air flow to a section of said wall beyond an end of said second radiant energy heat source means so that forced air flow is established along said wall of said second reaction chamber means.

11. The cold wall barrel epitaxial reactor of claim 10, said forced air cooling means further comprising:
means for exhausting said forced air flow to a heat exchanger after said forced air flow has passed over said exterior surface of said wall of said second reaction chamber means.

12. The cold wall barrel epitaxial reactor of claim 3, said unsymmetric radiant heat source means further comprising reflector means operatively connected to said column of lamps, said reflector means having a first end.

13. The cold wall barrel epitaxial reactor of claim 12 further comprising hanger means for positioning said susceptor means within said second reaction chamber means.

14. The cold wall barrel epitaxial reactor of claim 13 wherein said hanger means positions an end of said susceptor means in the range of about −0.25 to about 2.0 inches above said first end of said reflector means.

15. The cold wall barrel epitaxial reactor of claim 14 wherein said hanger means positions an end of said susceptor means about 0.25 inches above said first end of said reflector means.

16. The cold wall barrel epitaxial reactor of claim 13 wherein said hanger means positions said susceptor means in the range of about 1.8 to about 2.5 inches form a wall of said second reaction chamber means.

17. The cold wall barrel epitaxial reactor of claim 1 wherein said susceptor means comprises a first susceptor having a first flat zone and a second susceptor having a second flat zone which is greater in length than said first flat zone wherein for a specified batch of wafers only one of said first and second susceptors is included within said second reaction chamber means.

18. A package for increasing the batch size of a barrel epitaxial reactor having a first radiant energy heat source, a voltage controller for said first heat source, a first reaction chamber with a flat zone of a first length in a first direction, means for providing gas flow, and cooling means wherein said radiant energy heat source, and said reaction chamber were contained in a housing, said package comprising:
a second radiant energy heat source for replacing said first radiant energy heat source, said second radiant energy heat source having an unsymmetric heat energy distribution about the center of said heat source in said first direction; and
a second reaction chamber having a flat zone with a length in the range of about 25% to about 50% greater than said first flat zone length, wherein said second radiant energy source and said second reaction chamber are (i) operatively connectable with said voltage controller, said means for providing gas flow, and said cooling means and (ii) operatively mountable in said housing thereby increasing the batch size of the barrel epitaxial reactor.

19. A package as in claim 18 wherein said cooling means for said barrel epitaxial reactor includes blower means for providing forced air flow, said package further comprising:
means, operatively couplable to said blower means, for distributing said forced air flow through said second radiant energy heat source onto a wall of said second reaction chamber.

20. A package as in claim 19 further comprising:
means, operatively coupled to said distributing means, for diverting a portion of said forced air flow to a section of said wall beyond an end of said second radiant energy heat source so that forced air flow is established along said wall of said second reaction chamber.

21. A package as in claim 19 further comprising:
means for exhausting said forced air flow to a heat exchanger after said forced air flow has passed over said side wall of said second reaction chamber.

22. A package as in claim 18, said second radiant energy heat source having three regions wherein
a first region has an approximately uniform average radiant energy output;
a second region has an average radiant energy output greater than the average energy output of said first region; and
a third region has an average radiant energy output greater than the average energy output of said first region and less than the average energy output of said second region.

23. A package as in claim 18, said second radiant energy heat source having a length greater than the length of said first radiant energy heat source.

24. A package as in claim 18, said second radiant energy heat source comprising a column of lamps having a first end and a second end wherein the energy output of a first multiplicity of lamps at said first end of said column is different from the energy output of a second multiplicity of lamps at said second end of said column.

25. A package as in claim 24 wherein at least one lamp at said first end of said column has a higher energy output than the energy output of any other lamp in said column.

26. A package as in claim 24 wherein each lamp in a third multiplicity of lamps in said column of lamps has approximately the same energy output.

27. A package as in claim 26 wherein the energy output of each lamp in said first multiplicity of lamps is in the range of about 25% to about 100% greater than the energy output of any lamp in said third multiplicity of lamps.

28. A package as in claim 27 wherein the energy output of each lamp in said second multiplicity of lamps is in the range of about 25% to about 60% greater than the energy output of any lamp in said third multiplicity of lamps.

29. A package as in claim 28 wherein the energy output of each lamp in said second multiplicity of lamps is about equal.

30. A package for increasing the batch size of a barrel epitaxial reactor having a first radiant energy heat source having a predetermined length, a voltage controller for said first heat source, a first reaction chamber having a wall of a first predetermined length in a first direction, first susceptor means with a flat zone of a first length in said first direction, means for rotating said first susceptor, means for controlling gas flow, and cooling means, wherein said radiant energy heat source, said reaction chamber and said susceptor means were contained in a housing, said package comprising:
  second reaction chamber means, operatively mountable in said barrel epitaxial reactor housing, having a wall of a second predetermined length in said first direction wherein the second predetermined wall length is greater than said first predetermined wall length;
  second susceptor means, operatively mountable in said second reaction chamber means, having a flat zone with a length in said first direction in the range of about 25% to about 50% greater than the length of said first flat zone; and
  second radiant energy heat source means, operatively mountable in said barrel epitaxial reactor housing and operatively connectable to said voltage controller, having a length greater than the predetermined length of said first radiant energy heat source, and an unsymmetric energy distribution about the center of said second radiant energy heat source means in the direction of said length, wherein, upon mounting said package in said barrel epitaxial reactor housing, said reactor has an increased batch size for processing wafers and the epitaxial thickness and resistivity uniformities of wafers in said increased batch sizes are at least as good as the uniformities of said barrel epitaxial reactor prior to installation of said package.

31. A package as in claim 30, said second radiant energy heat source means comprising a column of lamps having a first end and a second end wherein the energy output of a first multiplicity of lamps at said first end of said column is different from the energy output of a second multiplicity of lamps at said second end of said column.

32. A package as in claim 31 wherein at least one lamp at said first end of said column has a higher energy output than the energy output of any other lamp in said column.

33. A package as in claim 31 wherein each lamp in a third multiplicity of lamps in said column of lamps has approximately the same energy output.

34. A package as in claim 33 wherein the energy output of each lamp in said first multiplicity of lamps is in the range of about 25% to about 100% greater than the energy output of any lamp in said third multiplicity of lamps.

35. A package as in claim 34 wherein the energy output of each lamp in said second multiplicity of lamps is in the range of about 25% to about 60% greater than the energy output of any lamp in said third multiplicity of lamps.

36. A package as in claim 35 wherein the energy output of each lamp in said second multiplicity of lamps is about equal.

37. A package as in claim 31 said second radiant heat source means further comprising reflector means operatively connected to said column of lamps, said reflector means having a first end.

38. A package as in claim 37 further comprising hanger means for positioning said second susceptor means in said second reaction chamber means.

39. A package as in claim 38 wherein said hanger means positions an end of said second susceptor means in the range of about −0.25 to about 2.0 inches above said first end of said reflector means.

40. A package as in claim 39 wherein said hanger means positions an end of said second susceptor means about 0.25 inches above said first end of said reflector means.

41. A package as in claim 38 wherein said hanger means positions said second susceptor means in the range of about 1.8 to about 2.5 inches from said wall of said second reaction chamber means.

42. A cold wall barrel epitaxial reactor for processing a multiplicity of wafers comprising:
  a housing;
    wherein said housing was for another epitaxial reactor that included a first reaction chamber having a side wall of a first length, a first heat source having a first length, a first susceptor with a flat zone of a first length; and
    said another epitaxial reactor further including a voltage controller, means for providing gas flow and cooling means,
  a second reaction chamber, operatively mounted in said housing and operatively connectable to said means for providing gas flow, having (i) a side wall transparent to radiant heat energy and a length greater than the length of said first reaction chamber, (ii) a gas entrance, and (iii) a gas exit;
  a second heat source, operatively mounted in said housing and operatively couplable to said voltage controller, comprising a plurality of radiant heat energy lamp banks surrounding said reaction chamber wherein each lamp bank comprises a column of radiant heat energy lamps extending in a direction from said reaction chamber gas entrance to said reaction chamber gas exit so that a first end of said column is located proximate to said reaction chamber gas entrance and a second end of said column is located proximate to said reaction chamber gas exit and further wherein;

said column has a length greater than the length of said first heat source; and said column having three heat zones consisting of a first plurality of said radiant heat energy lamps, a second plurality of said radiant heat energy lamps, and a third plurality of said radiant heat energy heat
- wherein the average energy output of said second plurality of lamps is a first level;
- the average energy output of said second plurality of lamps is a second level wherein said second level is greater than said first level; and
- the average energy output of said third plurality of lamps is a third level wherein said third level is greater than said second level so that said column of lamps has an unsymmetrical radiant energy field;

susceptor means, operatively mounted in said second reaction chamber means, having a flat zone length in the range of about 25% to about 50% greater than said first flat zone length, said susceptor means comprising:
- a second susceptor having a flat zone of a second length wherein said second length is in said range; and
- a third susceptor having a flat zone of a third length where said third length is different from said second length and said third length is in said range;
    - wherein for a batch of wafers with a specified diameter, only one of said second and third susceptors is included within said reaction chamber;

means, operatively coupled to said cooling means, for distributing forced air flow through said second heat source onto said wall of said second reaction chamber; and means, operatively connected to said distributing means, for diverting forced air flow to a portion of said second reaction chamber wall proximate said gas entrance so that forced air flow is established along said wall of said second reaction chamber.

* * * * *

UNITED STATES PATENT AND TRADEMARK OFFICE
CERTIFICATE OF CORRECTION

PATENT NO.   :   5,207,835
DATED        :   May 4, 1993
INVENTOR(S)  :   Gary M. Moore It is certified that error appears in the above-identified patent and that said Letters Patent is hereby corrected as shown below:

Col. 16, line 13, delete "165".

Col. 16, line 14, after "susceptor" insert --165--.

Col. 26, line 9, Claim 16, delete "form" and insert --from--.

Signed and Sealed this

Twenty-eighth Day of May, 1996

Attest:

BRUCE LEHMAN

*Attesting Officer*   *Commissioner of Patents and Trademarks*